(12) United States Patent
Washio et al.

(10) Patent No.: US 6,600,178 B1
(45) Date of Patent: Jul. 29, 2003

(54) HETEROJUNCTION BIPOLAR TRANSISTOR

(75) Inventors: Katsuyoshi Washio, Tokorozawa (JP); Reiko Hayami, Kokubunji (JP); Hiromi Shimamoto, Tokorozawa (JP); Masao Kondo, Higashimurayama (JP); Katsuya Oda, Hachioji (JP); Eiji Oue, Ome (JP); Masamichi Tanabe, Tokyo (JP)

(73) Assignees: Hitachi, Ltd., Tokyo (JP); Hitachi DeviceEngineering Co., Ltd., Mobara (JP)

(*) Notice: Subject to any disclaimer, the term of this patent is extended or adjusted under 35 U.S.C. 154(b) by 160 days.

(21) Appl. No.: 09/599,741

(22) Filed: Jun. 23, 2000

(30) Foreign Application Priority Data

Jun. 23, 1999 (JP) .......................................... 11-177032B

(51) Int. Cl.[7] ....................... H01L 29/737; H01L 29/161
(52) U.S. Cl. ....................... 257/197; 257/191; 257/588; 257/592; 257/616
(58) Field of Search ................................. 257/191, 197, 257/616

(56) References Cited

U.S. PATENT DOCUMENTS

| | | | | |
|---|---|---|---|---|
| 5,285,088 A | * | 2/1994 | Sato et al. | 257/616 |
| 5,302,841 A | * | 4/1994 | Yamazaki | 257/616 |
| 5,323,031 A | * | 6/1994 | Shoji et al. | 257/197 |
| 5,352,912 A | * | 10/1994 | Crabbe et al. | 257/616 |
| 5,440,152 A | * | 8/1995 | Yamazaki | 257/197 |
| 5,721,438 A | * | 2/1998 | Tang et al. | 257/197 |

* cited by examiner

Primary Examiner—Gene M. Munson
(74) Attorney, Agent, or Firm—Antonelli, Terry, Stout & Kraus, LLP

(57) ABSTRACT

A bipolar transistor is provided which is of high reliability and high gain, and which is particularly suitable to high speed operation. The bipolar transistor operates with high accuracy and with no substantial change of collector current even upon change of collector voltage. It also has less variation than conventional bipolar transistors for the collector current while ensuring high speed properties and high gain. In one example, the band gap in the base region is smaller than the band gap in the emitter and collector regions. The band gap is constant near the junction with the emitter region and decreases toward the junction with the collector region. A single crystal silicon/germanium is a typically used for the base region.

6 Claims, 20 Drawing Sheets

HETEROJUNCTION BIPOLAR TRANSISTOR

BACKGROUND OF THE INVENTION

1. Field of the Invention

The present invention concerns a bipolar transistor. The present invention is useful when applied, for example, to a bipolar transistor using silicon/germanium as a base layer. More in detail, the present invention concerns a bipolar transistor which operates with high accuracy, and which is suitable for high speed operation at high gain.

2. Related Art

For increasing the operation speed of bipolar transistors, it is necessary to reduce the thickness of the base layer. In this case, if the thickness of the base layer is simply decreased, the result is a problem of depletion of the base layer, which causes a short circuit between the collector and the emitter when voltage is applied between the collector and the emitter. As the concentration in the base layer is generally increased along with reduction of the thickness of the base layer, this decreases a collector current which results in a problem that no sufficient current gain can be obtained. On the other hand, since a bipolar transistor using single crystal silicon/germanium as a base layer has no such a problem, it has already been proposed. An example of the bipolar transistor using single crystal silicon/germanium for the base layer is disclosed, for example, in IEDM Technical.Digest, 1993, p. 71 to 74. FIG. 2 shows the distribution of germanium in the bipolar transistor in this example. The abscissa denotes the depth in the crystal body while the ordinate denotes the germanium ratio (%). The diagram shows regions for the emitter, base, collector and depletion layer in each of the junction regions. Lines (a), (b), and (c) in FIG. 2 show examples of germanium distribution in these regions.

Generally, by using single crystal silicon/germanium with a smaller band gap than that of single crystal silicon for the base layer of a bipolar transistor, the injection efficiency of electrons from the emitter to the base is improved to increase the collector current and, accordingly, a sufficient current gain can be obtained. Then, as distribution (a) or distribution (b) in FIG. 2 shows, the band gap is decreased from the emitter to the collector to form an electric field in the base layer by increasing the germanium content in the base layer from the emitter to the collector. As a result, electrons in the base layer can be accelerated, and the operation speed of the semiconductor device can be increased. Further, since the collector current is controlled by the electric field in the base layer, it is possible to obtain a good characteristic in which the collector current does not change substantially even if the collector voltage is changed.

The present invention intends to provide a bipolar transistor which is of high reliability and high gain and which is suitable for high speed operation. In view of a more concrete technical feature, the present invention provides a bipolar transistor capable of operating with high accuracy with no substantial change in a collector current even when there is a change in a collector voltage with the bipolar transistor of the present invention also operates with less fluctuation of the collector current, while ensuring high speed operation and high gain.

For attaining such a purpose, problems to be solved will be explained below referring, for example, to a bipolar transistor using a single crystal silicon/germanium for a base layer as a typical example of the present invention.

A bipolar transistor using single crystal silicon/germanium having the germanium distributions (a) and (b) as shown in FIG. 2 described above involves the following problems.

That is, an end position EBb0 of the depletion layer for the emitter/base junction on the side of the base situates at a position where the germanium contents change. Therefore, when the end position EBb0 of the depletion layer for the emitter/base junction on the side of the base changes, the band gap at the position fluctuates. Fluctuation of the band gap at the end position EBb0 is caused, for example, in a case where the depth of the emitter region usually formed by thermal diffusion changes. Since the collector current changes in accordance with an exponential function of the band gap, the collector current changes greatly by the fluctuation of the position EBb0 of the depletion layer for the emitter/base junction on the side of the base.

In order to prevent this, it may be considered to make the distribution of germanium uniform in the base layer, as shown in the distribution (c). However, in this case, it is not possible to obtain a high operation speed obtained by the germanium distribution or a characteristic that the collector current does not change substantially, even when the collector voltage is changed as shown in the distribution (a) or the distribution (b) in FIG. 2.

The present invention intends to provide a semiconductor device, particularly, a bipolar transistor of high accuracy which is capable of attaining a high speed operation or a characteristic that a collector current does not change substantially, even when a collector voltage is changed, and with less fluctuation of the collector current. The present invention is useful, particularly, in a bipolar transistor using a single crystal silicon/germanium layer as a base layer.

SUMMARY OF THE INVENTION

The present invention intends to create a constitution in which, even when the end position of a depletion layer for the emitter/base junction on the side of the base is fluctuated, the band gap at that position is not changed. Accordingly, while the collector current changes in accordance with an exponential function of the band gap, the collector current does not change, even if the position of the depletion layer for the emitter/base junction on the side of the base is changed.

Further, the band gap is decreased toward the collector in a base region in which the band gap does not change substantially. This enables forming an electric field in the base layer to accelerate electrons in the base layer. Therefore, The operation speed can be increased for the semiconductor device. Further, since the collector current is controlled by the electric field in the base layer, it is possible to obtain a good characteristic that the collector current does not change substantially, even when the collector voltage is changed.

In another feature, the present invention is constituted such that even when the position of the depletion layer for the collector/base junction on the side of the base is changed when the collector voltage is changed, the band gap does not fluctuate at that position. Accordingly, it is possible to provide a bipolar transistor which operates with high accuracy and with less fluctuation of its characteristics even upon change of the collector voltage.

DESCRIPTION OF THE INVENTION

Various embodiments of the present invention will be set forth below.

Figure 1:
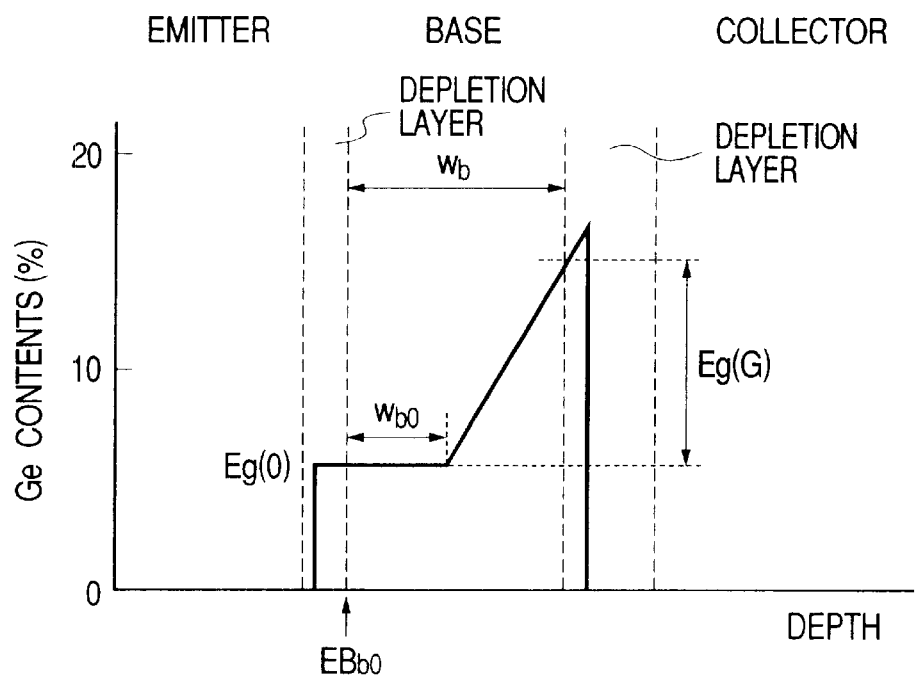
FIG. 1 is a distribution diagram of a germanium content illustrating a first embodiment of a bipolar transistor according to the present invention.

In a typical semiconductor device according to the present invention, a band gap of a first single crystal semiconductor layer of a first conductivity type, for example, a base region referring to FIG. 1, is smaller than a band gap for each of second and third single crystal semiconductor layers (emitter and collector, respectively) of a second conductivity type opposite to the first conductivity type, and a band gap of the first single crystal semiconductor layer is constant near the junction with the second single crystal semiconductor layer, and decreases toward the junction with a third single crystal semiconductor layer.

Further, another embodiment of the present invention is a semiconductor device having a first conductor layer of the first conductivity type and second and third semiconductor layers each having a junction with the first semiconductor layer and of a conductivity type, opposite to the first conductivity type, in which a band gap of the first semiconductor layer is smaller than the band gap for the second and third semiconductor layers. The band gap of the first semiconductor layer is increased and then decreased from the side of the second semiconductor layer toward the junction of the first and third semiconductor layers.

Figure 25:
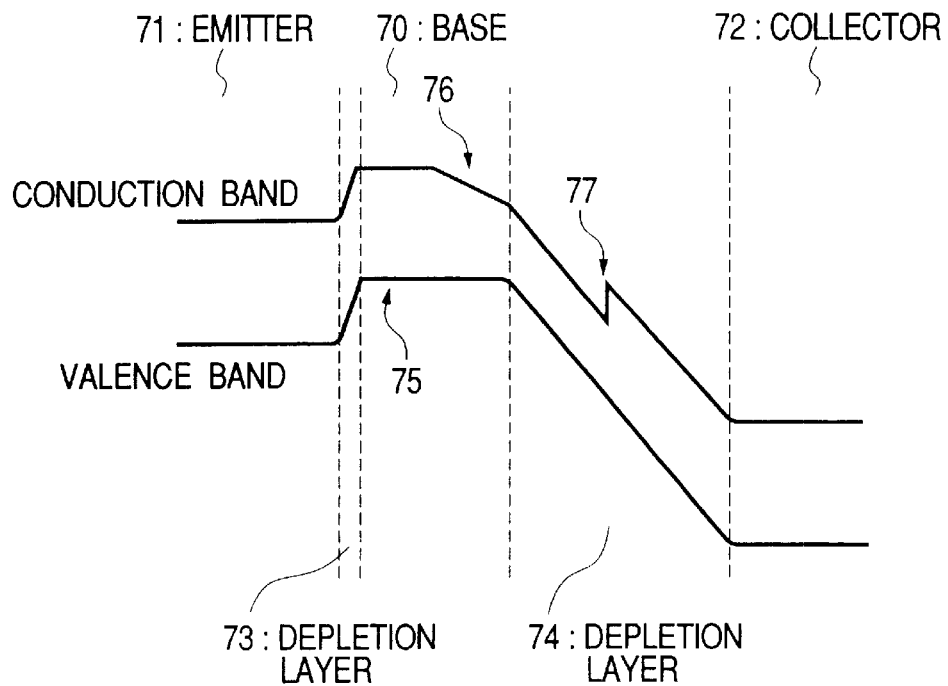
FIG. 25 is a band structural view as an example of a present invention.

FIG. 25 shows a band structural view corresponding to the example shown in FIG. 1. FIG. 1 shows an example of using silicon/germanium as a base layer, and the concept shown by this band structural view is applicable to the present invention. Further, the structure of the bipolar transistor according to the present invention can be basically practiced, using ordinary bipolar transistor construction. Accordingly, this is explained here by using a schematic view thereof. This is also identical with other various examples according to the basic construction of the present invention. More concrete and practical structures of the invention will be explained later, with reference to the drawings. Further, the functions and the effects based on the construction of the present invention will also be explained further in the column for embodiments.

The base region of a first single crystal semiconductor layer 70 of first conductivity type forms a junction with an emitter region of a second single crystal semiconductor layer 71 of a second conductivity type, opposite to the first conductivity type, and a collector region of a third single crystal semiconductor layer 72 of a second conductivity type, opposite to the first conductivity type. The band gap of the first single crystal semiconductor layer 70 is smaller than the band gap for each of the second and third single crystal semiconductor layers 71 and 72. Further, in this embodiment, the band gap of the first single crystal semiconductor layer 70 has a substantially constant region 75 near the junction with the second single crystal semiconductor layer 71, and has a region 76 decreasing toward the junction with the third single crystal semiconductor 72. Reference numerals 73 and 74 represent respectively depletion layers formed near the junctions. Region 75 is a region corresponding to Wb0 shown in FIG. 1. There is a region 77 where the band gap of the depletion layer changes abruptly. It is noted that this shows portions for a germanium containing region and a not germanium containing region in FIG. 1.

Figure 5:
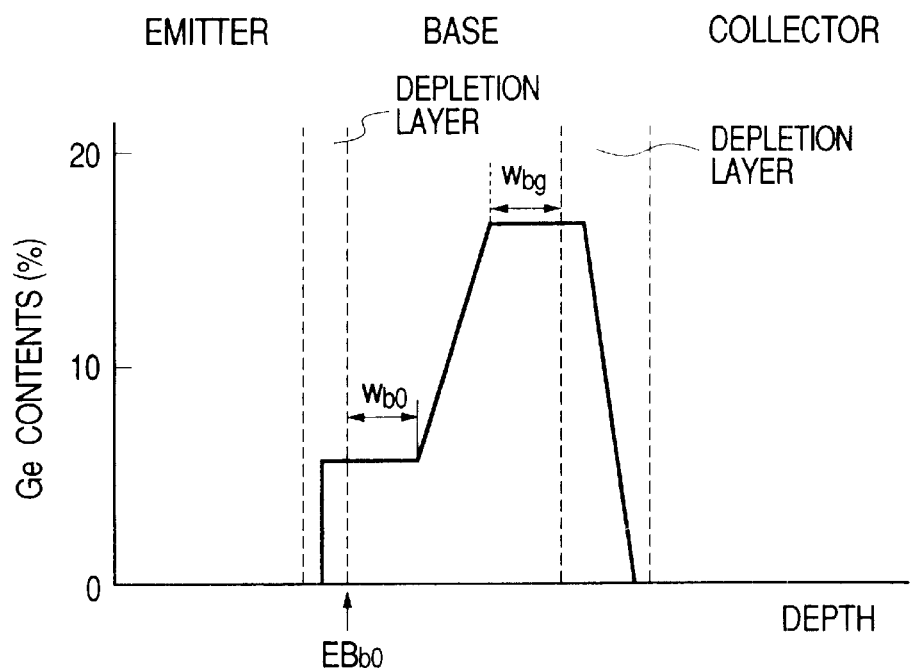
FIG. 5 is a distribution diagram of a germanium content illustrating a third embodiment of a bipolar transistor according to the present invention.

The band gap of the first single crystal semiconductor layer may be constant near the junction with the third single crystal semiconductor layer, as shown in FIG. 5.

For example, it is often designated such that the band gap which is in a range of being substantially constant is within a range of about ±0.5% in view of fluctuation of the band gap and measurement error.

Figure 26:
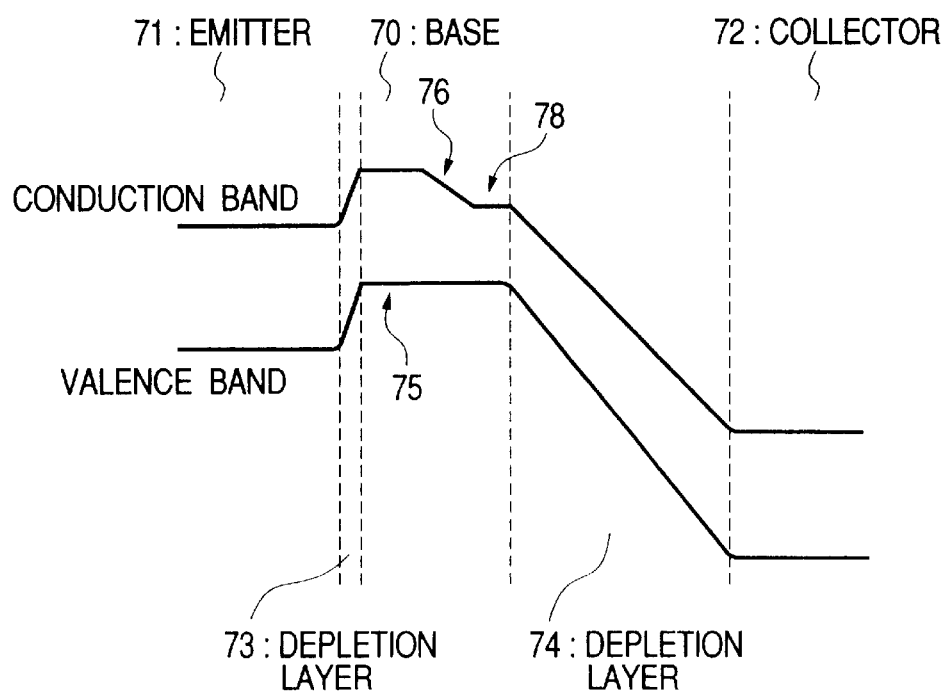
FIG. 26 is a band structural view as another example of a present invention.

FIG. 26 shows a band structural view corresponding to an example in FIG. 5. While FIG. 5 is an example of using silicon/germanium as the base layer, the concept shown in this band structural view is applicable to the present invention.

Like that shown in FIG. 25, the base region of the first single crystal semiconductor layer 70 of the first conductivity type forms a junction with an emitter region of a second single crystal semiconductor layer 71 of a second conductivity type, opposite to the first conductivity type and with a collector region of a third single crystal semiconductor layer 72 of a second conductivity type opposite to the first conduction type. Then, the band gap of the first single crystal semiconductor layer 70 is smaller than the band gap of each of the second and third single crystal semiconductor layers 71 and 72. In this example, the band gap of the first single crystal semiconductor layer 70 has a substantially constant region 75 near the junction with the second single crystal semiconductor layer 71, and has a region 76 decreasing toward the junction with the third single crystal semiconductor layer 72. Region 75 corresponds to Wb0 in FIG. 5, and the region 78 corresponds to Wbg in FIG. 5. Further, reference numerals 73 and 74 respectively show depletion layers formed near the junctions.

Various embodiments of the present invention will be explained below. While band structural views corresponding to such embodiments are not appended, these structures will be understood sufficiently by referring to FIGS. 25 and 26 described previously.

Figure 6:
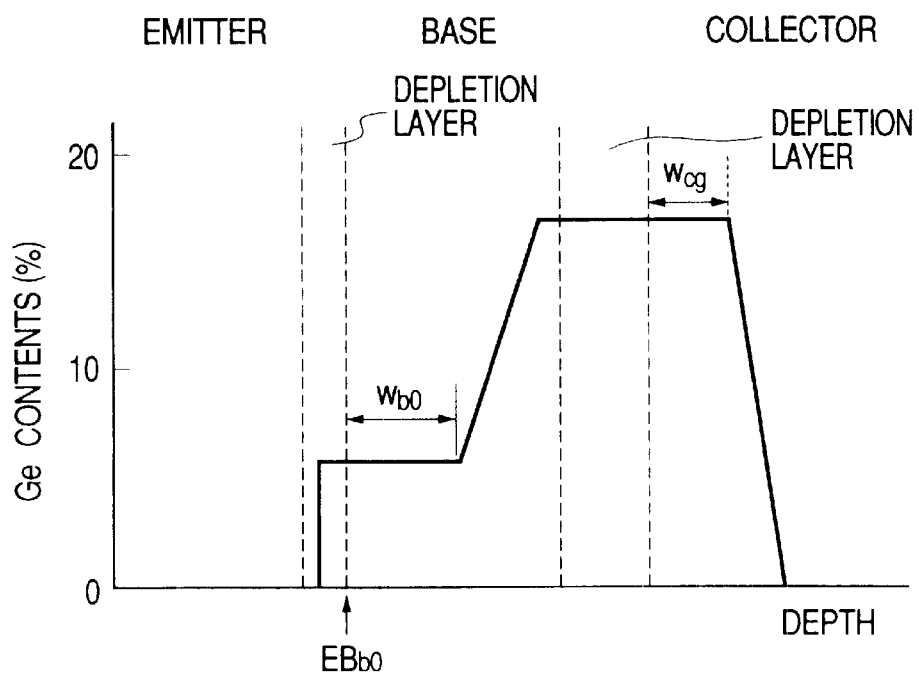
FIG. 6 is a distribution diagram of a germanium content illustrating a fourth embodiment of a bipolar transistor according to the present invention.

The band gap of the third single crystal semiconductor layer may be identical to the band gap of the first single crystal semiconductor layer near the junction with the first single crystal semiconductor layer, as shown in FIG. 6. Wcg in FIG. 6 shows this region. Other basic constitutions are identical to those of the example in FIG. 5.

The thickness of the portion where the band gap of the first single crystal semiconductor layer is constant near the junction with the second single crystal semiconductor layer is preferably at least 5 nm.

Figure 7:
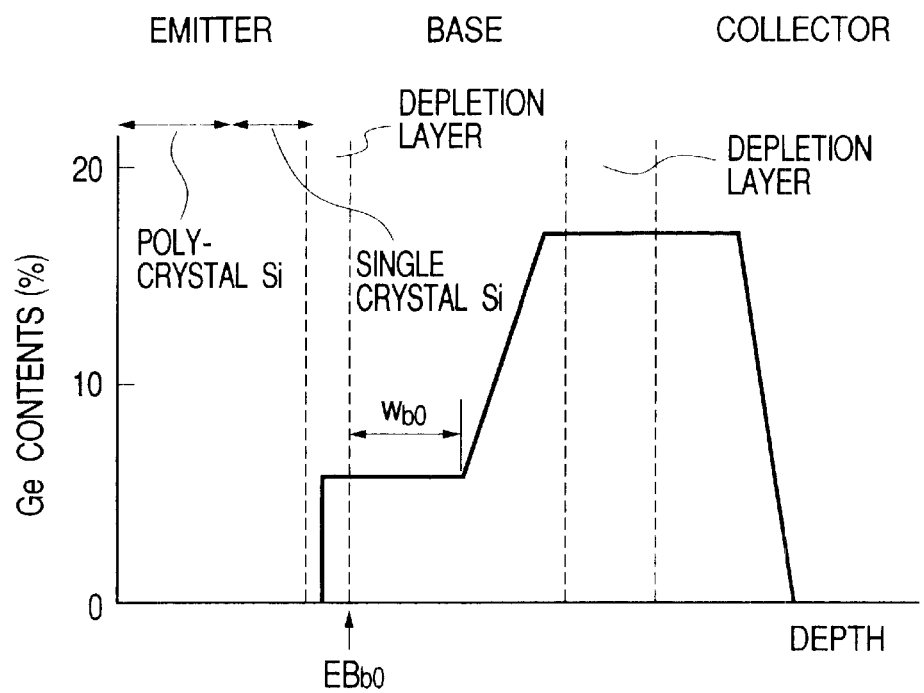
FIG. 7 is a distribution diagram of a germanium content illustrating a fifth embodiment of a bipolar transistor according to the present invention.

As shown in FIG. 7, a fourth semiconductor layer of a second conductivity type, which has a band gap larger than that of the second single crystal semiconductor layer and which is connected with the second single crystal semiconductor layer, may be disposed on the side opposite to the junction between the first single crystal semiconductor layer and the second single crystal semiconductor layer. In the example of FIG. 7, polycrystal Si is used for the fourth semiconductor layer.

In the examples of the present invention, it is preferred that the band gap of the first single crystal 15 silicon/germanium layer is controlled in the semiconductor silicon/germanium layer by the germanium content in the single crystal semiconductor layer. Silicon/germanium materials are fully investigated in the semiconductor device field and are very preferable for the present invention. Moreover, a silicon/germanium material system is preferable for maintaining the band gap profile in a comparatively high temperature region. In view of this point, a silicon/germanium system is preferable.

Another embodiment of the present invention comprises at least a fifth single crystal semiconductor layer of the second conductivity type, a multi-layered film comprising a first insulating film having an opening disposed on the surface of the fifth single crystal semiconductor layer, a first polycrystal semiconductor layer of the first conductivity type, a second insulating layer, a third single crystal semiconductor layer of the second conductivity type disposed in the opening, a first single crystal semiconductor layer of the first conduction type disposed on the third single crystal semiconductor layer, a second polycrystal semiconductor layer of the first conductivity type disposed adjacent to each of the first single crystal semiconductor layer of the first conductivity type, the first insulating film and the first polycrystal semiconductor layer of the first conduction type, and a second single crystal semiconductor layer disposed on the first single crystal semiconductor layer.

It is preferred that a third insulating layer disposed adjacent to the first polycrystal semiconductor layer, the second insulating layer, the second polycrystal semiconductor layer, and the second single crystal semiconductor layer.

It is preferred that a fourth semiconductor layer be disposed adjacent to the second single crystal semiconductor layer and the third insulating layer.

It is preferred that the first insulating film disposed on the surface of the fifth single crystal semiconductor layer of the second conductivity type and having the opening comprises a silicon oxide film and a silicon nitride film. The silicon oxide film is in contact with the fifth single crystal semiconductor layer, and the silicon nitride film is adjacent with the first polycrystal semiconductor layer.

It is preferred that a third polycrystal semiconductor layer be disposed facing the opening of the first insulating film on at least a portion between the silicon oxide film and the silicon nitride film constituting the first insulating film.

It is preferred that a portion at a impurity concentration higher than that of other portions of the fifth single crystal semiconductor layer be disposed on at least a portion of the fifth single crystal semiconductor layer of the second conductivity type.

It is preferred that a portion at an impurity concentration higher than that in other portions of third single crystal semiconductor layer be disposed on at least a portion of the third single crystal semiconductor layer of the second conductivity type.

It is preferred that a metal or a metal compound be disposed on at least a portion of the upper surface of the first polycrystal semiconductor layer.

It is preferred that the first and second polycrystal semiconductor layers comprise a polycrystal silicon layer or a polycrystal silicon/germanium layer.

It is preferred that the third polycrystal semiconductor layer comprises a polycrystal silicon layer or a polycrystal silicon/germanium layer.

It is preferred that the fourth semiconductor layer comprises a polycrystal silicon layer or a polycrystal silicon/germanium layer.

This is suitable to a bipolar transistor using the first single crystal semiconductor layer as a base, the second single crystal semiconductor layer as the emitter, and the third single crystal semiconductor layer as the collector.

Further embodiments of the present invention are set forth below.

(1) A further embodiment of the present invention is a semiconductor device comprising at least a fifth semiconductor layer of the second conductivity type, a first insulating-film disposed on the surface of the fifth semiconductor layer, a first polycrystal semiconductor layer of the first conductivity type, and a second insulating layer, the first insulating film, the first polycrystal semiconductor layer and the second insulating layer each having an opening. This embodiment further comprises a third semiconductor layer of the second conductivity type disposed on the opening, a first semiconductor layer of the first conductivity type disposed on the third semiconductor layer, a second polycrystal semiconductor layer of the first conductivity type disposed adjacent to: each of the first semiconductor layer of the first conductivity type, the first insulating film, the first polycrystal semiconductor layer, and the second semiconductor layer of the second conductivity type disposed on the first semiconductor layer.

(2) A further embodiment of the present invention is a semiconductor device as defined in (1) above, having a third insulating layer adjacent with the first polycrystal semiconductor layer, the second insulating layer, the second polycrystal semiconductor layer, and the second semiconductor layer.

(3) A further embodiment of the present invention is a semiconductor device as defined in (2) above, comprising a fourth semiconductor layer of the second conductivity type adjacent with the second semiconductor layer and the third insulating layer.

(4) A further embodiment of the present invention is a semiconductor device as defined in any one of (1) to (3), in which the first insulating film disposed on the surface of the fifth semiconductor layer has an opening comprising a silicon oxide film and a silicon nitride film. The silicon oxide film is adjacent with the fifth single crystal semiconductor layer, and the silicon nitride film is adjacent with the first polycrystal semiconductor layer.

(5) A further embodiment of the present invention is a semiconductor device as defined in (4) above, comprising a third polycrystal semiconductor layer facing the opening of the first insulating film on at least a portion between the silicon oxide film and the silicon nitride film constituting the first insulating film.

(6) A further embodiment of the present invention is a semiconductor device as defined in any one of (1) to (5) above, having a portion at an impurity concentration higher than that in other portion of the fifth semiconductor layer on at least a portion of the fifth semiconductor layer.

(7) A further embodiment of the present invention is a semiconductor device as defined in any one of (1) to (6) above, having a portion at an impurity concentration higher than that in other portion of the third semiconductor layer on at least a portion of the third semiconductor layer.

(8) A further embodiment of the present invention is a semiconductor device as defined in any one of (1) to (7) above, having a metal or a metal compound on at least a portion of the upper surface of the first polycrystal semiconductor layer.

(9) A further embodiment of the present invention is a semiconductor device as defined in any one of (1) to (8) above, in which the first and the second polycrystal semiconductor layers comprise a polycrystal silicon layer or a polycrystal silicon/germanium layer.

(10) A further embodiment of the present invention is a semiconductor device as defined in any one of (1) to (9) above, in which the third polycrystal semiconductor layer comprises a polycrystal silicon layer or a polycrystal silicon/germanium layer.

(11) A further embodiment of the present invention is a semiconductor device as defined in any one of (1) to (10) above, in which the fourth polycrystal semiconductor layer comprises a polycrystal silicon layer or a polycrystal silicon/germanium layer.

(12) A further embodiment of the present invention is a semiconductor device as defined in any one of (1) to (11) above, in which the semiconductor device is a bipolar transistor using the first semiconductor layer as a base, the second semiconductor layer as an emitter and the third semiconductor layer as a collector.

(13) A further embodiment of the present invention is a bipolar transistor in which an end position of a depletion layer for the emitter/base junction on the side of a base is constituted such that the band gap at that position does not change, even if the position of the depletion layer for the emitter/base junction on the side of the base changes.

(14) A further embodiment of the present invention is a bipolar transistor in which an end position of a depletion layer for the emitter/base junction on the side of a base is constituted such that the band gap at that position does not change even if the position of the depletion layer for the emitter/base junction on the side of the base changes, and the band gap is decreased in the base region toward the collector.

(15) A further embodiment of the present invention is a bipolar transistor in which an end position of a depletion layer for the emitter/base junction on the side of a base is constituted such that the band gap at that position does not change, even if the position of the depletion layer for the emitter/base junction on the side of the base changes, the band gap is decreased in the base region toward the collector, and the band gap does not change at that position even when the position, of the depletion layer for the collector/base junction on the side of the base changes in a case where the collector voltage is changed.

(16) A further embodiment of the present invention is an optical receiving system comprising a photodetector for receiving optical signals and outputting electrical signals, a first amplifier circuit receiving the electrical signals from the photodetector, a second amplifier circuit for receiving the output from the first amplifier circuit, and a decision circuit for converting the output from the second amplifier circuit into a digital signal in synchronization with predetermined clock signals, wherein the first amplifier circuit has a first bipolar transistor connected at the base thereof with the photodetector and a second bipolar transistor, connected at the base thereof with a base of a first bipolar transistor and connected at the collector thereof with the input of the second amplifier circuit, in which at least one of the first or the second bipolar transistors is constituted with a semiconductor device or a bipolar transistor according to the present invention.

(17) A further embodiment of the present invention is an optical receiving system in which both the first and second bipolar transistors are constituted with a semiconductor device or a bipolar transistor according to the present invention.

(18) A further embodiment of the present invention is an optical receiving system as defined in (16) or (17) above, in which the first and second bipolar transistors are formed on one identical semiconductor chip, and the semiconductor chip and the photodetector are mounted on a single substrate.

(19) A further embodiment of the present invention is a semiconductor integrated circuit having an amplifier circuit comprising at least a pair of bipolar transistors with at least a pair of emitters thereof being connected with each other, in which the pair of the bipolar transistors are constituted with the semiconductor device or the bipolar transistor according to the present invention.

Various embodiments of the present invention have been described above and practical embodiments thereof will be explained.

In a typical example of a preferred embodiment of a semiconductor device according to the present invention, a band gap of a first single crystal semiconductor layer of the first conductivity type as a base region of a bipolar transistor is smaller than a band gap of second and third single crystal semiconductor layers of the second conductivity type forming an emitter region and a collector region, the band gap of the first single crystal semiconductor layer as the base region is constant near the junction with the second single crystal semiconductor layer of the emitter region and decreased toward the, junction with the third single crystal semiconductor layer of the collector region..

In this embodiment, when the first single crystal-semiconductor layer comprises a single crystal silicon germanium layer and the band gap is controlled a germanium content in the single crystal silicon/germanium layer, since the end position of the depletion layer for emitter/base junction on the side of the base is present at a portion where the germanium content is constant, even when the position of the depletion layer for emitter/base junction on the side of the base fluctuates (for example, when the depth of the emitter regions usually formed by thermal diffusion is changed), the band gap at that position does not change. Accordingly, while the collector current changes in accordance with the exponential function of the band gap, the collector current does not change even when the position of the depletion layer for emitter/base junction on the side of the base fluctuates.

Further, the band gap can be decreased toward the collector by increasing the germanium content toward the collector in a base region where the band gap does not change. Accordingly, this can form an electric field in the base layer to accelerate electrons in the base layer. Accordingly, operation speed can be increased as the characteristic of the semiconductor device. Further, since the collector current is controlled by the electric field in the base layer, it is possible to obtain a good characteristic that the collector current does not change substantially even when the collector voltage is changed.

The usual design thickness for the base, emitter and collector in the present invention may suffice for bipolar transistors. For example, transistors are often designed such, that the thickness is about 5 nm to 100 nm for the base layer, and about 10 nm to 200 rn for the emitter layer. Further, while the thickness of the collector layer has no significant effect on the present invention, it is often designed to be between about 0.1 nm to 1 $\mu$m.

It is usually determined that Eg(O) is about 5% to 15% converted as the germanium content, and the width of Eg(G) is usually about 5% to 15% converted as the germanium content. Wb0 is preferably within a range from 5 nm to 20 nm. Wbg is preferably less than one half of the base layer, and Wbg is often set to at least 5 nm. Wcg is often set to at least to 5 nm.

Further, in another preferred embodiment of the semiconductor device according to the present invention, the band gap of the first single crystal semiconductor layer may be constant near the junction with the third single crystal semiconductor layer, or the band gap of the third single crystal semiconductor layer may be equal to the band gap of the first single crystal semiconductor layer near the junction with the first single crystal semiconductor layer. Further, it is preferred that the thickness of the portion where the band gap of the first single crystal semiconductor layer is constant near the junction with the second single crystal semiconductor layer be at least 5 nm. Further, a fourth semiconductor layer of the second conductivity type with a band gap larger than that of the second single crystal semiconductor layer connected to the second single crystal semiconductor layer may be disposed on the side opposite to the junction between the first single crystal semiconductor layer.

While the typical embodiment of the present invention is explained referring to an example using silicon/germanium as the base layer, various kinds of semiconductor materials, that is, semiconductor materials capable of constituting bipolar transistors are applicable to the present invention.

It will be apparent that the present invention can be practiced also by using, for example, group III-V compound semiconductor materials and group II-VI compound semiconductor materials as alternative kinds of semiconductor materials. Typical examples of the group III-V compound semiconductor materials can include mixed crystals of (Al, Ga, In) and (As, P, Sb, N). They are, for example, AlAs, AlP, AlSb, AlN, GaAs, GaP, GaSb, GaN, InAs, InP, InSb and InN. Further, mixed crystals comprising three or four elements of these may also be used.

The group II–VI compound semiconductor materials can include, as typical examples, mixed crystals of chalcogenide series with Zn, Cd or Hg.

Further concrete embodiments of the semiconductor device according to the present invention will be explained more in detail with reference to the accompanying drawings. In the following embodiments, examples of changing the band gap of the base region using germanium-containing silicon crystals, which are excellent in practical use, are shown. However, it will be apparent that other semiconductor materials may also be used in each of the embodiments, as described, above with identical functions and effects.

Embodiment 1

FIG. 1 is a distribution diagram of germanium illustrating a first embodiment of a semiconductor device according to the present invention. The abscissa denotes the depth in the crystal body and the ordinate denotes the germanium ratio (%). The diagram shows each of the regions for the emitter, base and collector, as well as the depletion layer in each of the junction regions. In FIG. 1, a solid polygonal line shows an example of the germanium distribution in the regions.

Now, it is explained that a bipolar transistor capable of operating with high accuracy and with high gain that is suitable to high speed operation can be realized based on the distribution of germanium shown in FIG. 1.

Assuming that the amount of decrease of the band gap in the single crystal silicon/germanium layer at the position EBb0 of the depletion layer for the emitter/base junction on the side of the base is Eg(O) and the amount of decrease of the band gap toward the collector/base junction is Eg(G), relative to the band gap of the single crystal silicon, it is known that the collector current is in proportion with the product of the exponential function for Eg(O) and Eg(G).

Figure 2:
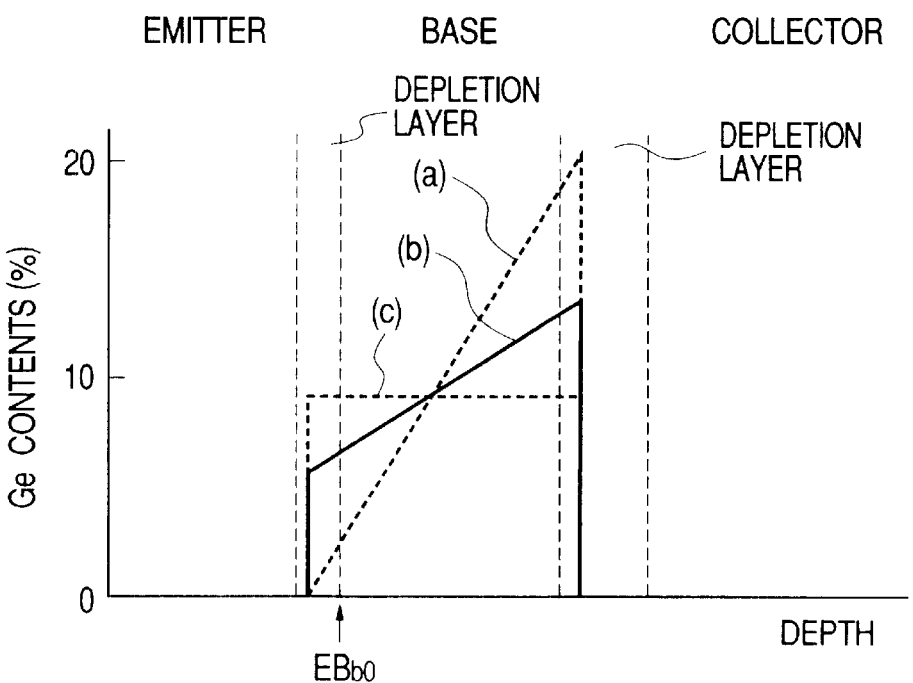
FIG. 2 is a distribution diagram of a germanium content illustrating an existing conventional bipolar transistor.
Figure 3:
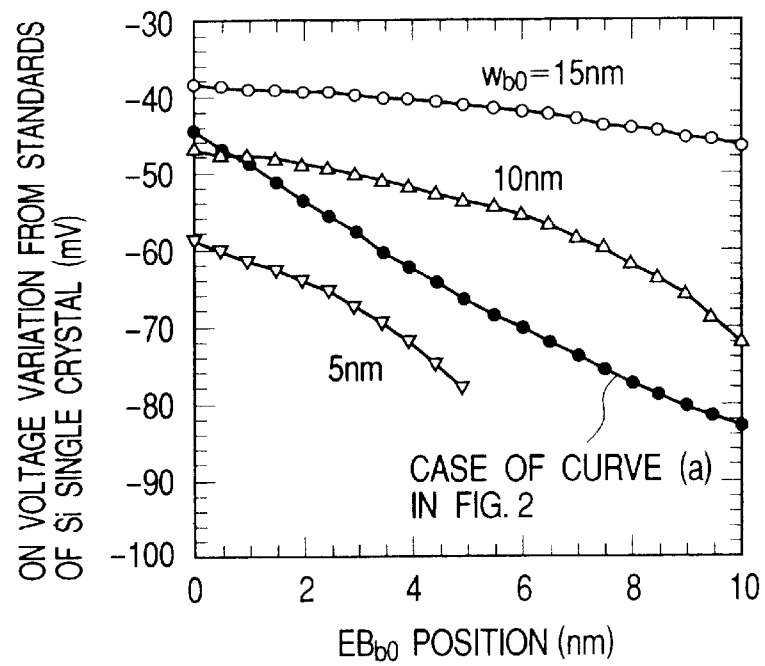
FIG. 3 is a characteristic graph illustrating voltage change in a bipolar transistor, shown FIG. 1 and FIG. 2.

Accordingly, considering the example of the distribution of germanium for the distribution (a) shown in FIG. 2 described above for a previously existing bipolar transistor, the change of on voltage from the single crystal silicon changes substantially linearly relative to the end position EBb0 of the depletion layer for the emitter/base junction on the side of the base. This example is shown in FIG. 3 for the case illustrated by distribution (a) of FIG. 2. As a result, the on voltage changes by as much as 4 mV or more with only a 1 nm change for the end position EBb0 of the depletion layer for the emitter/base junction on the side of the base. The amount of change is larger by at least one digit compared with existing bipolar transistors made only of single crystal silicon. This is attributable in the existing example to the fact that the end position EBB0 of the depletion layer for the emitter/base junction on the side of the base is present at a portion where the germanium content is changed, so that the band gap Eg(O) is fluctuated at the position.

FIG. 3 is a characteristic diagram showing the change of the on voltage of the bipolar transistor shown in FIG. 1 and FIG. 2.

On the contrary, in this example, the germanium content is made constant in the base region near the end position EBb0 of the depletion layer for the emitter/base junction on the side of the base (base region at depth Wb0). Accordingly, as shown in FIG. 3, the change of the on voltage is relative to the end position EBb0O of the depletion layer for the emitter/base junction on the side of the base. This is because the end position EBB0 of the depletion layer for the emitter/ base region on the side of the base is situated at a portion where the germanium content is constant, so that the band gap Eg(O) at that position does not fluctuate.

However, as shown in FIG. 3, if the depth Wb0 is too small for the region where the germanium content is constant (for example, in the case of 5 nm for Wb0) near the end position EBb0 of the depletion layer for the emitter/base junction on the side of the base, the effect of this embodiment is decreased. This is because the collector current depends on the integrated amount of the carriers for the entire base region. That is, the integration amount of the carriers changes relative to the change of the end position EBb0 of the depletion layer for the emitter/base junction on the side of the base if the region for the constant germanium content is decreased excessively.

Therefore, Wb0 has to be about 5 nm or more in order to decrease the fluctuation of the on voltage compared with the existent case. Since the amount of change of the on voltage when Wb0 is about 15 nm can be decreased to about 0.5 mV, relative to the change of 1 nm at the end position EBb0 of the depletion layer for the emitter/base junction on the side of the base. Since the width Wb for the base region selected for attaining a high speed performance in a bipolar transistor is usually about 20 m to 50 nm, this value for Wb0 is sufficiently practical.

As explained above, this example can provide a bipolar transistor of high accuracy and, in addition, since a region of increasing the germanium content to the collector is disposed in the base region, the band gap can be decreased to the collector, thereby forming an electric field in the base layer to accelerate electrons in the base layer and increase the operation speed. Further, since the collector current is controlled by the electric field in the base layer, a good characteristic can be obtained that the collector current does not change substantially even when the collector voltage is changed.

Further, the emitter/base junction position has to be determined exactly in order to obtain a desired collector current in a case where the germanium content is changed at the position of the depletion layer for the emitter/base junction on the side of the base, as shown in the existent example. A desired collector current can be designed easily in this example by selecting a constant germanium content near the end position EBb0 of the depletion layer for the emitter/base junction on the side of the base.

This example can form a high speed bipolar transistor of high accuracy with high current gain or high cutoff frequency. As a result, by the use of the transistor, it is possible to attain increased speed and higher performance for the circuit requiring high accuracy.

Embodiment 2

Figure 4:
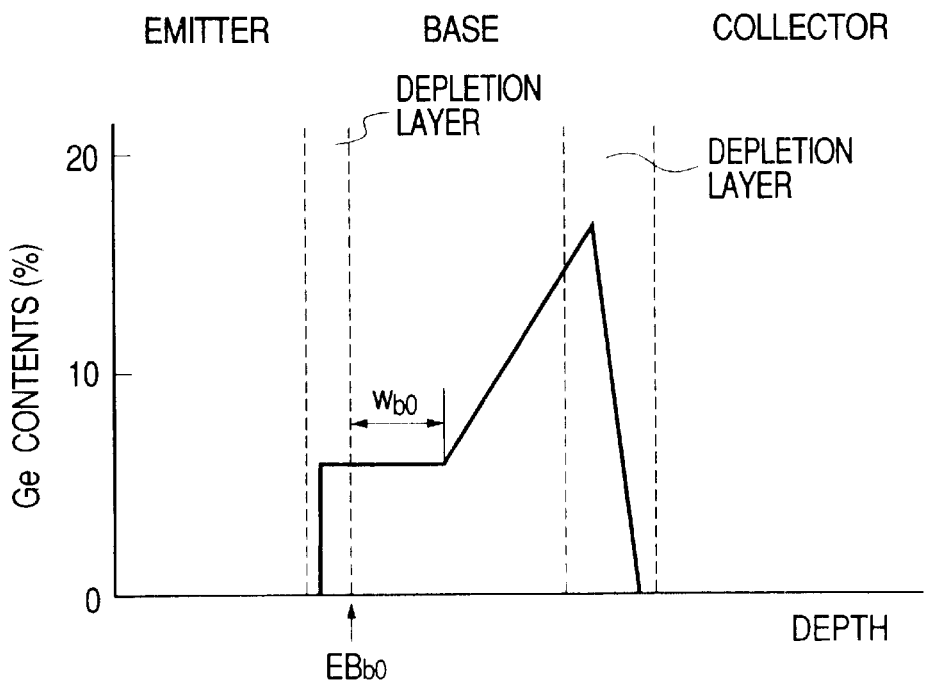
FIG. 4 is a distribution diagram of a germanium content illustrating a second embodiment of a bipolar transistor according to the present invention.

FIG. 4 is a distribution diagram of germanium showing a second embodiment of a semiconductor device according to the present invention. The abscissa denotes the depth in a crystal body, and the ordinate denotes a germanium content (%). In the diagram, each of the regions for the emitter, base and collector, and each of the regions of the depletion layer in each junction region are shown. A polygonal line in FIG. 4 shows the example of germanium distribution in these regions.

As in the Embodiment 1, the germanium content in the base region near the end position EBb0 of the depletion layer for the emitter/base junction on the side of the base is made constant, and the change of the on voltage relative to the end position EBb0 is decreased: Then, a region of increasing the germanium content toward the collector is disposed within the base region to form an electric field in the base layer and electrons in the base layer are accelerated for the purpose of high speed operation and, further, the fluctuation of the collector current relative to the change of the collector voltage is made smaller.

The depth Wb0 in a region where the germanium content is constant near the end position EBb0 of the depletion layer for the emitter/base junction on the side of the base may be considered in the same manner as for Embodiment 1. Further, this concept is also identical for the various embodiments shown below.

In this embodiment, since the germanium content is the highest at the collector/base junction, a range is provided for a region of decreasing germanium to single crystal silicon from the highest germanium content at the collector/base junction. This can prevent an abrupt increase of the band gap near the collector/base junction, thereby keeping the speed of the electrons accelerated in the base region, as well as being able to suppress the occurrence of crystal defects caused by lattice mismatching at the collector/base junction.

According to this embodiment, it is possible to form a bipolar transistor having high reliability, high current gain, high cutoff frequency and high accuracy.

Embodiment 3

FIG. 5 is a distribution diagram of germanium showing a third embodiment of the semiconductor device according to the present invention. The abscissa shows the depth in the crystal body while the ordinate shows the germanium ratio (%)

In the diagram, each of the regions for the emitter, base and collector, and depletion layer in each of the junction regions are shown. A polygonal line in FIG. 5 shows an example of germanium distribution in these regions.

As in Embodiments 1 and 2, the germanium content is made constant in the base region near the end position EBb0 of the depletion layer for the emitter/base junction on the side of the base to decrease the change of the on voltage to the end position EBb0 of the depletion layer for the emitter/base junction on the side of the base. Then, a region where the germanium content increases toward the collector is disposed in the base region to form an electric field in the base layer thereby accelerating electrons in the base layer in order to increase the operation speed and, further, decrease the fluctuation of the collector current relative to the change of the collector voltage.

In this embodiment, the germanium content in the base region near the collector/base junction is made constant (base region for the depth Wbg).

This is due to the following reason. If the germanium content changes in the base region near the collector/base junction, when the collector voltage is changed in order to change the width of the depletion layer, the position of the depletion layer for the collector/base junction on the side of the base is changed in order to fluctuate the germanium content in the base-region near the collector/base junction, and change the integration amount of the carriers over the entire base region. Therefore, since the collector current depends on the integration amount of the carriers for the entire base region, the collector current fluctuates. Thus, the fluctuation of the collector current must be prevented.

According to this embodiment, when the collector voltage is changed, and if the position of the depletion layer for the collector/base junction on the side of the base is changed, since this is in a region where the germanium content is constant, the band gap at the position does not fluctuate, making possible a bipolar transistor of high accuracy with less fluctuation of characteristics irrespective of changes in the collector voltage.

Embodiment 4

FIG. 6 is a distribution diagram of germanium illustrating a fourth embodiment of a semiconductor device according to the present invention. The abscissa denotes the depth in the crystal body and the ordinate denotes the germanium ratio (%). The figure shows each of the regions for the emitter, base, collector and the depletion layer in each of the junction regions. A solid polygonal line in FIG. 6 illustrates an example of the germanium distribution in the regions.

As in Embodiments 1 to 3, the germanium content in the base region near the end position EBb0 of the depletion layer for the emitter/base junction on the side of the base is made constant in order to decrease the change of the on voltage at the end position EBb0 of the depletion layer for the emitter/base junction on the side of the base. Then, a region where the germanium content increases toward the collector is disposed in the base region to form an electric field in the base layer thereby accelerating electrons in the base layer in order to increase the operation speed and, further, decrease the fluctuation of the collector current relative to the change of the collector voltage.

In this embodiment, a region where the germanium content is constant (collector region for depth Wcg) is also disposed in the collector region.

By disposing a region where germanium is decreased from the highest germanium content to single crystal silicon in the collector region, even when the operation current density of the bipolar transistor increases to extend the base region toward the collector region, the germanium content in the base region is not lowered, and a region hindering electrons is not formed in the conduction band. This makes possible a high speed operation even at a high current density.

Further, it is known that the diffusion coefficient of boron in the single crystal silicon/germanium layer (impurity of the base layer) is lower by about one digit when compared with that in the single crystal silicon with a germanium content of about 10% to 20% (typically around about 15%). Therefore, when germanium is also mixed in the collector region, diffusion of boron by a heat treatment which is required for the manufacture of transistors can be suppressed, which is effective for narrowing the width of the base layer and, as a result, high speed operation performance can be obtained.

Further, the semiconductor device according to the present invention is also applicable, for example, to carbon introduced hetero/bipolar transistors.

The depletion layer region at the collector/base junction in FIG. 6 shows a case where a voltage is not applied to the collector. In this example, since the impurity concentration in the collector region is lower by about one digit or more when compared with the impurity concentration in the base region, when the voltage for usual operation is applied to the collector, the collector region in which germanium is mixed is of the depletion layer region at the collector/base junction. Therefore, in view of the band structure, a notch at the conduction band in the collector region is substantially eliminated, and the operation speed of the semiconductor device is not deteriorated.

According to this embodiment, a bipolar transistor of high current gain, with high cutoff frequency and of high accuracy can be operated at a high current density.

Embodiment 5

FIG. 7 is a distribution diagram for germanium showing a fifth embodiment of a semiconductor device according to the present invention. The abscissa denotes the depth in the crystal body and the ordinate denotes the germanium ratio (%). The diagram illustrates each of the regions for the emitter, base, collector and the depletion layer for each of the junction regions. A solid polygonal line in FIG. 7 illustrates an example of the germanium distribution in the regions.

As in Embodiments 1 to 4, the germanium content in the base region near the end position EBb0 of the depletion layer for the emitter/base junction on the side of the base is made constant in order to decrease the change of the on voltage to the end position EBb0 of the depletion layer for the emitter/base junction on the side of the base. Then, a region where the germanium content increases toward the collector is further disposed in the base region to form an electric field in the base layer, thereby accelerating electrons in the base layer in order to increase the operation speed and, further, decrease the fluctuation of the collector current relative to the change of the collector voltage.

In this embodiment, the emitter region is constituted with a polycrystal silicon region and a single crystal silicon region. FIG. 7 shows both of the regions in the emitter region. In a case where the polycrystal silicon is used for the emitter, a positive hole current injected to the emitter, that is, a base current, is decreased due to the effect of the oxide film present at the boundary between the polycrystal and single crystal silicon, and the effect is obtained of a polycrystal silicon with increased grain size that behaves as if the band gap were widened. Accordingly, the current gain can be improved further when the polycrystal silicon is used for the emitter. This can widen the range for the selection of the constant germanium content in the base region near the end position EBb0 of the depletion layer for the emitter/base junction on the side of the base, in order to obtain the effect of the present invention more remarkably.

Embodiment 6

Figure 8:
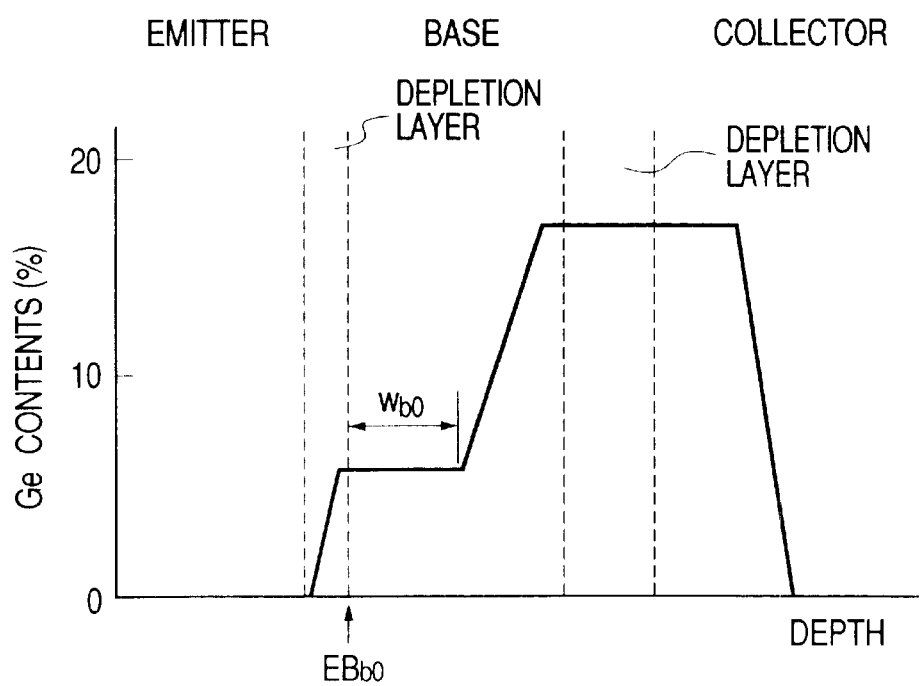
FIG. 8 is a distribution diagram of a germanium content illustrate a sixth embodiment of a bipolar transistor according to the present invention.

FIG. 8 is a distribution diagram for germanium showing a sixth embodiment of a semiconductor device according to the present invention. The abscissa denotes depth in the crystal body and the ordinate denotes the germanium ratio (%). The diagram shows each of the regions for the emitter, base, collector, and the depletion layer for each of the junction regions. A solid polygonal line in FIG. 8 shows an example of the germanium distribution in the regions.

As in Embodiments 1 to 5, the germanium content in the base region near the end position EBb0 of the depletion layer for the emitter/base junction on the side of the base is made constant in order to decrease the change of the on voltage to the end position EBb0 of the depletion layer for the emitter/base junction on the side of the base. Then, a region where the germanium content increases toward the collector is disposed in the base region to form an electric field in the base layer thereby accelerating electrons in the base layer in order to increase the operation speed and, further, decrease the fluctuation of the collector current relative to the change of the collector voltage.

In this embodiment, germanium is decreased for a certain range from the side of the base of the depletion layer for the emitter/base junction to the single crystal silicon of the emitter. This can prevent an abrupt lowering of the band gap near the emitter/base junction, thereby suppressing notch in the conduction band and assuring the capability of accelerating electrons smoothly from the emitter to the base in order to attain a high speed operation. Also, the occurrence of crystal defects caused by lattice mismatching at the emitter/base junction can be suppressed. Further, the end position EBb0 of the depletion layer for the emitter/base junction on the side of the base may be designed so as not to be situated in the sloped portion for the germanium distribution.

The distribution of germanium in the semiconductor device has been explained with reference to the preferred embodiments. Now, main examples for the concrete structures of the semiconductor will be explained.

Various examples of the basic constitution of the emitter, base and collector of a bipolar transistor have been illustrated. The following examples of the embodiments have concrete features in other constitutions of the transistor. In the following examples, basic constitutions of the emitter, base and collector in the embodiments described above can be used, depending on the specification or the purposes thereof.

Various forms for changing the band gap on the side of the emitter and the collector have been illustrated for the basic constitution of the main portion of the bipolar transistor, but it will be apparent that they may be combined with each other. Further, this can of course be applied to the basic constitution of the main portion of the bipolar transistor to be described hereinafter.

Embodiment 7

Figure 9:
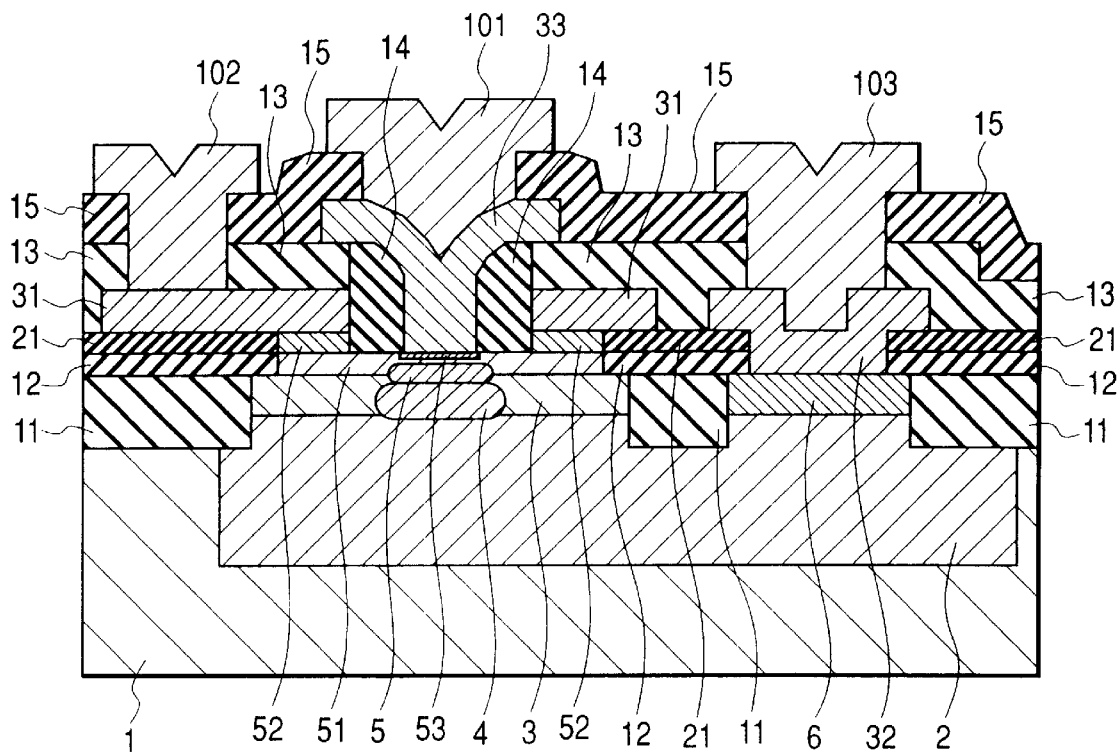
FIG. 9 is a cross sectional view illustrating a seventh embodiment of a bipolar transistor according to the present invention.

FIG. 9 is a cross sectional structural view illustrating a seventh embodiment of a bipolar transistor according to the present invention. At first, structural features of the embodiment will be outlined, and then the manufacturing method will be explained.

This embodiment has a structure in which a single crystal silicon/germanium layer 51 is disposed only to the openings of insulating films 12 and 21, and a base lead electrode 31 comprising polycrystal silicon and the single crystal silicon/germanium layer 51 are in contact with each other by way of an extrinsic base 52. Various constitutions explained for Embodiments 1 to 6 can be used for the single crystal silicon/germanium layer 51.

Each of the layers constituting the device can be manufactured by the usual methods for manufacturing silicon series semiconductor devices. Although the details of such methods will be explained subsequently, the openings of the insulating layer 12 and the insulating layer 21 are determined in a self-aligned manner relative to the emitter region 53. Accordingly, since the junction area between the single crystal silicon/germanium layer 51 and the low concentration collector region 3 is made smaller, the collector/base junction capacity can be reduced. Accordingly, this is effective for an increase of the operation speed and reduction of power consumption in the semiconductor device, in cooperation with the effect of the distribution of the germanium content in the single crystal silicon/germanium layer 51 of the present invention. In the bipolar transistor, polycrystal silicon/germanium may also be used for the base lead electrode 31. The constitution for the layers described above is also identical in other embodiments of the present invention.

In this embodiment, a silicon nitride film is used for the insulating layer 21 of the insulating layers 12 and 21 at the periphery of a region forming the single crystal silicon/germanium layer 51. In selective growth, a lateral side, generally referred to as a facet, which is different from the growing direction in, accordance with the direction of the face of the substrate, is formed on the lateral side of the growing layer to make the cross sectional shape trapezoidal for the growing layer. In this embodiment, selectivity upon growth of the silicon/germanium layer 51 is given only to the silicon oxide film. Thus, during growth of the single crystal silicon/germanium layer 51, the polycrystal silicon/germanium layer 52 is also formed on the lateral side of the silicon nitride film 21, in order to moderate the phenomenon described above. A good connection is thus obtained between the base lead electrode 31 of polycrystal silicon and the single crystal silicon/germanium layer 51. This can increase the area of contact between the intrinsic base and the extrinsic base to reduce the variation of the base resistance at the connected portion and also reduce the base resistance.

Further, this is also effective in the reduction of the collector/base capacitance, since the intrinsic base and the extrinsic base can be connected without increasing the contact resistance, even when the length of the base lead electrode 31 of polycrystal silicon overhang from the openings of the insulating films 12 and 21 is shortened. Accordingly, in the bipolar transistor according to the present invention, high speed operation is made possible by the reduction of the parasitic resistance and the parasitic capacitance.

Further, in this embodiment, a collector region 4 having a carrier concentration that is about one digit higher than that in the low concentration collector region 3 is disposed in the low concentration collector region 3 before growth of the single crystal silicon/germanium layer 51 and, further, a collector region 5 having the same level of carrier concentration as that in the collector region 4 is also disposed after the growth of the single crystal silicon/germanium layer 51. They can further improve the operation speed performance of the transistor. However, since this results in an increase of the parasitic capacitance and lowering of the withstand voltage of the transistor, they can be omitted if necessary.

Figure 10:
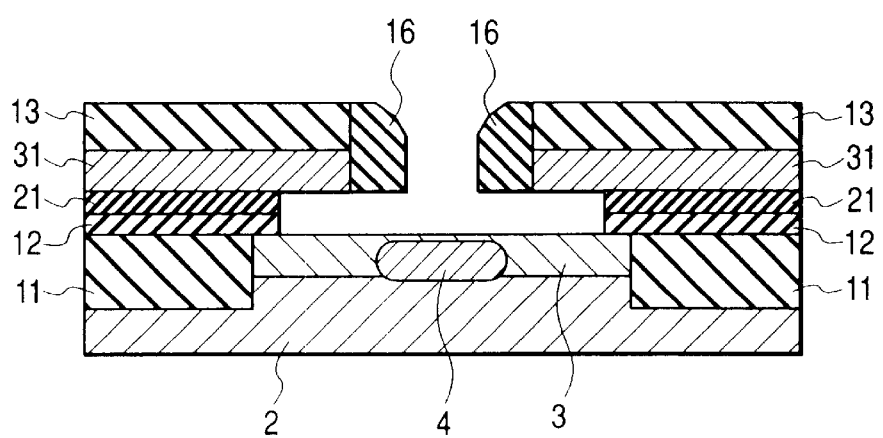
FIG. 10 is a fragmentary, enlarged cross sectional view illustrating a manufacturing method of a bipolar transistor according to the present invention shown in FIG. 9
Figure 11:
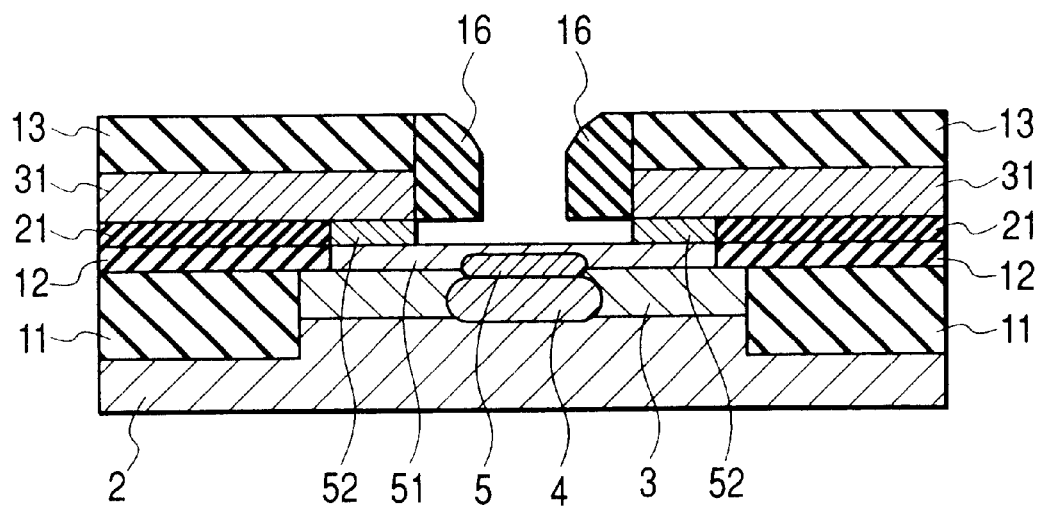
FIG. 11 is a fragmentary, enlarged cross sectional view illustrating a manufacturing method of a bipolar transistor according to the present invention shown in FIG. 9.
Figure 12:
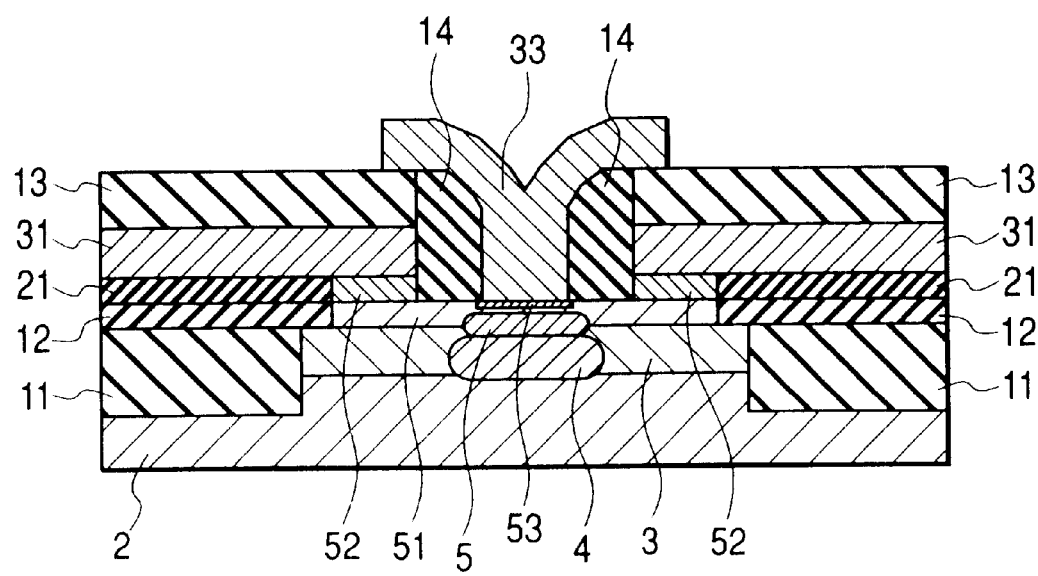
FIG. 12 is a fragmentary, enlarged cross sectional view illustrating a manufacturing method of a bipolar transistor according to the present invention shown in FIG. 9.

A method of manufacturing the bipolar transistor of the structure shown in FIG. 9 will be explained with reference to FIGS. 10 to 12. FIGS. 10 to 12 are cross sectional views of the device illustrated in the order of manufacturing steps. In the drawings, the semiconductor substrate 1 is not illustrated, and a structure that is at and above a high concentration n-type buried layer 2 formed on the semiconductor substrate 1, shown in FIG. 9, is illustrated.

An n-type collector layer 3 at a low concentration is epitaxially grown over the entire surface of the p-type silicon substrate 1 formed with a high concentration n-type buried layer 2, and a device isolation insulating film 11 comprising a silicon oxide film is formed. The device isolation is conducted by a usual method. Then, a collector/base isolation insulating layer 12 comprising a silicon oxide film, a collector/base isolation insulating film 21 comprising a silicon nitride film, a base lead electrode 31 comprising polycrystal silicon (or polycrystal silicon/germanium), and an emitter/base isolation insulating film 13 are formed. Then, an opening of the emitter/base isolation insulating film 13 and the base lead electrode 31 is formed in the laminate structure by usual etching. After forming a second emitter/base isolation insulating film 16 for each side wall of the first emitter/base isolation insulating film 13 and the base lead electrode 31, phosphorus is ion implanted to form a collector region 4 only in the region corresponding to the region for the opening. The collector/base isolation insulating films 21 and 12 are etched by isotropic etching. Thus, the collector/base isolation insulating films 21 and 12, shown in FIG. 10, are obtained (FIG. 10).

Then, a single crystal silicon/germanium layer 51 is formed by epitaxial growth on the low concentration n-type collector layer 3 by epitaxial growing. In this step, growing is conducted under the condition that the polycrystal silicon/germanium is not deposited on the first emitter/base isolation insulating film 13 and the second emitter/base isolation insulating film 16, by utilizing the difference between the growth start time of the single crystal silicon/germanium on the single crystal silicon and the growth start time of the polycrystal silicon/germanium on the insulating film.

For example, under the condition of an epitaxial growing temperature of 6000 C. and a growing pressure of 1 Pa, the thickness of the single crystal silicon growing on single crystal silicon is 50 mn or less and, while polycrystal silicon is deposited on the silicon nitride film, the polycrystal silicon is not deposited on the silicon oxide film, even for growing single crystal silicon (germanium content=0%). Further, in a case of silicon/germanium, the critical thickness in the selective growth increases as the germanium content increase, when the single crystal silicon/germanium grows by about 20 m on the single crystal silicon, the polycrystal silicon/germanium is not deposited on the silicon oxide film nor on the silicon nitride film at the germanium content of 30%. When growing is continued further and the single crystal silicon/germanium is grown to 20 to 150 m on the single crystal silicon, while the polycrystal silicon is deposited on silicon nitride film, the polycrystal silicon/germanium is not deposited on the silicon oxide film. Accordingly, by the selective growth of the intrinsic base layer within this range, the polycrystal silicon/germanium is deposited on the side wall of the collector/base isolation insulating film 21 comprising the silicon nitride film,. and the polycrystal silicon/germanium is not deposited on the emitter/base isolation insulating films 13 and 16 comprising the silicon oxide film.

For the growth described above, a gas source MBE (Molecular Beam Epitaxy) method or a CVD (Chemical Vapor Deposition) method can be used with the CVD method being preferable for the satisfactory control of the selectivity. Further, the range for the growing temperature is between 500 C. or above where a satisfactory selectivity is obtained between the silicon oxide film and the silicon nitride film and the polycrystal silicon and at or below 800 C. as the upper limit at which crystal defects start to be formed. Under the growing temperature range described above, the growing pressure may be 100 Pa or lower for starting the growth of the polycrystal silicon/germanium layer on the silicon oxide film or the silicon nitride film.

Further, the selective growth can also be attained supplying a chlorine gas (Cl) or a hydrogen chloride gas (HCl) during growing. For example, at an epitaxial growing temperature of 650 C. and under; with a growing pressure of 10,000 Pa, a polycrystal silicon is not deposited on a silicon oxide film or a silicon nitride film even for growing single crystal silicon (germanium content=0%), if the HCl flow rate is made 50% or more in the entire starting gas flow rate.

Further, in the case of silicon/germanium, the HCl flow rate may be reduced as the germanium content increases, and the polycrystal silicon/germanium is not deposited on the silicon oxide film or the silicon nitride film at a 30% germanium content, by controlling the HCl flow rate to 20% or more for the entire starting gas flow rate. For the growing process, a gas source MBE method or the CVD method may be used, with the CVD method being preferred for favorable control of the selectivity. Further, the temperature range is at 500 C. or higher, at which favorable selectivity is obtained between the silicon oxide film and the silicon nitride film and the polycrystal silicon and at 800 C. or below as an upper limit where crystal defects start to be formed.

Then, phosphorus is ion implanted into the semiconductor laminate structure prepared as described above, to form a collector region 5 only for the single crystal silicon/germanium region corresponding to a portion below the opening of the emitter/base isolation insulating film 16 (FIG. 11).

Along with growth of the single crystal silicon/germanium, an extrinsic base 52 comprising polycrystal silicon/germanium is formed at the overhang portion of the base lead electrode 31 and the side wall of the collector/base isolation insulating film 21. Then, when the thickness of the collector/base isolation insulating films 12 and 21 and the sum of the thickness of the single crystal silicon/germanium layer 51 and the polycrystal silicon/germanium layer 52 deposited below the overhang portion of the base lead electrode 31 become identical, the overhang portion is completely filled, and the intrinsic base 51 and the base lead electrode 31 are connected by way of the extrinsic base 52.

Then, the emitter/base isolation insulating film 16 is removed by etching, and an emitter/base isolation insulating film 14 is formed to each of the side walls for the emitter/base isolation insulating film 13, the base lead electrode 31 and the extrinsic base 52 comprising polycrystal silicon/germanium. Further, a high concentration n-type polycrystal silicon 33 forming an emitter diffusion source and an emitter electrode is deposited, patterned and annealed in order to diffuse the n-type impurity into the single crystal silicon/germanium layer 51 and form an emitter region 53 (FIG. 12).

Subsequently, an insulating film 15 is deposited and an opening is formed in each of the regions for the emitter, base and collector, and an emitter electrode 101, a base electrode 102, and a collector electrode 103 are formed covering the opening in order to form a semiconductor device. The cross sectional in this state is shown in FIG. 9.

In this embodiment, since the base resistance and the collector/base junction capacitance can be reduced, a high speed bipolar transistor having a cutoff frequency and a highest oscillation frequency, each of 50 GHz or higher, can be obtained and, further, since the variation of the base resistance or the collector current can be reduced, this transistor can be used effectively for increasing the operation speed and improving the performance of circuits having high accuracy.

By adopting various examples explained thus far for the basic constitution of the base and the collector in this embodiment, transistors taking advantages of such features in addition to the structural features of this embodiment can be obtained. This is applicable also to other embodiments which will be described later.

Embodiment 8

Figure 13:
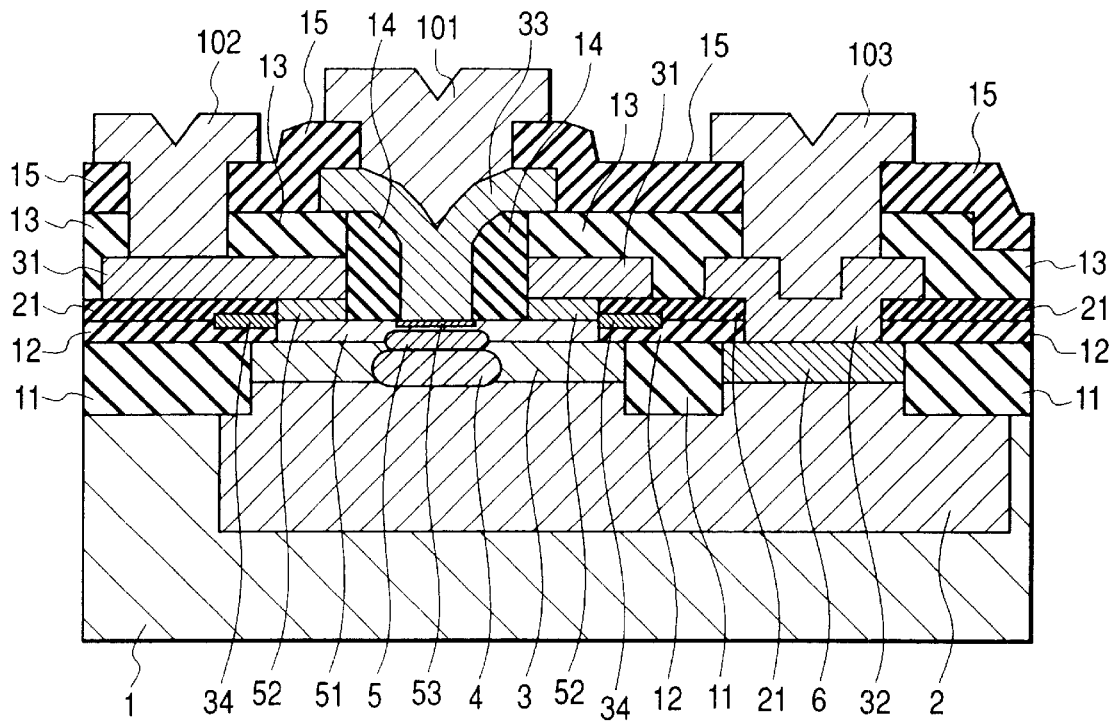
FIG. 13 is a cross sectional view illustrating an eighth embodiment of a bipolar transistor according to the present invention.

FIG. 13 is a cross sectional, structural view illustrating an eighth embodiment of a bipolar transistor according to the present invention. First, structural features of the embodiment will be outlined and then the manufacturing method will be explained.

This embodiment has a structure in which a single crystal silicon/germanium layer 51 is disposed only in the openings of insulating films 12 and 21, and a base lead electrode 31 comprising polycrystal silicon and the single crystal silicon/germanium layer 51 are in contact with each other by way of an extrinsic base 52. Various constitutions explained for Embodiments 1 to 6 can be used for the single crystal silicon/germanium layer 51. Further, in this embodiment, a polycrystal silicon layer 34 is disposed between the insulating films 12 and 21 at the periphery of the region forming the single crystal silicon/germanium layer 51.

The openings of the insulating layer 12 and the insulating layer 21 are determined in a self-aligned manner relative to the emitter region 53. Since the junction area between the single crystal silicon/germanium layer 51 and the low concentration collector region 3 is made smaller, the collector/base junction capacity can be reduced, which is effective for increasing the operation speed and reducing the power consumption in the semiconductor device in cooperation with the effect of the distribution of the germanium content in the single crystal silicon/germanium layer 51 of the present invention.

As described above, the polycrystal silicon layer 34 is disposed between the insulating films 12 and 21 at the periphery of the region for forming the single crystal silicon/germanium layer 51. In selective growth, a lateral side, referred to as a facet, which is different from the growing direction in accordance with the direction of the face of the substrate, is formed on the lateral side of the growing layer to make the cross sectional shape trapezoidal for the growing layer In this embodiment, since the selectivity upon growth of the silicon/germanium layer 51 is given only to the silicon oxide film during growth of the single crystal silicon/germanium layer 51, the polycrystal silicon/germanium layer 52 is also formed on the lateral side of the silicon nitride film 21 and the polycrystal silicon/germanium layer 52, in order to moderate the phenomenon described. As a result, a good connection can be obtained between the base lead electrode 31 of polycrystal silicon and the single crystal silicon/germanium layer 51. This can increase the area of contact between the intrinsic base and the extrinsic base, which results in the reduction of the variation of the base resistance at the connected portion and also the reduction of the base resistance.

Further, this is also effective for the reduction of the collector/base capacitance, since the intrinsic base and the extrinsic base can be connected without increasing the contact resistance, even when the overhang length of the base lead electrode 31 of polycrystal silicon from the openings of the insulating films 12 and 21 is shortened.

Accordingly, in the bipolar transistor according to the present invention, high speed operation is made possible by the reduction of the parasitic resistance and the parasitic capacitance. The bipolar transistor of this embodiment can be easily form by modifying the manufacturing method described for the Embodiment 8 so that the polycrystal silicon layer 34 is deposited and patterned and then the insulating film 21 is also deposited.

Embodiment 9

Figure 14:
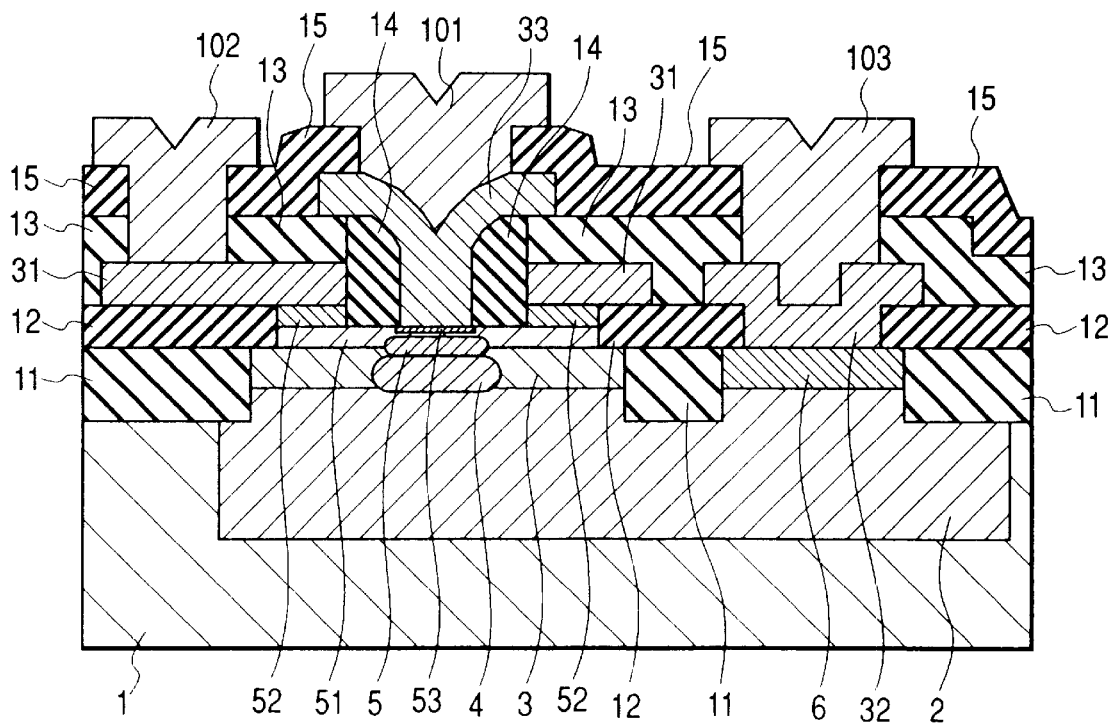
FIG. 14 is a cross sectional view illustrating a ninth embodiment of a bipolar transistor according to the present invention.

FIG. 14 is a cross sectional, structural view illustrating a ninth embodiment of a bipolar transistor according to the present invention.

This embodiment has a structure in which a single crystal silicon/germanium layer 51 is disposed only in the opening of an insulating film 12, and a base lead electrode 31 comprising polycrystal silicon and the single crystal silicon/germanium layer 51 are in contact with each other by way of an extrinsic base 52. Various constitutions explained for Embodiments 1 to 6 can be used for the single crystal silicon/germanium layer 51.

Further, in this embodiment, the opening of the insulating film 12 is determined in a self-aligned manner to a designed emitter region 53. Accordingly, since the area of junction between the single crystal silicon/germanium layer 51 and the low concentration collector region 3 is made smaller due to the self-alignment, the collector/base junction capacitance can be reduced. This is effective, in cooperation with the effect of the distribution of the germanium content in the single crystal silicon/germanium layer 51 of the present invention, for increasing the operation speed and reducing the power consumption of the semiconductor device.

In this embodiment, only the insulating film 12 is disposed to the periphery of the region for forming the single crystal silicon/germanium layer 51. In conducting selective growth, a lateral side, referred to as a facet, which is different in the growing direction in accordance with the direction of the plane of the substrate, is formed on the lateral side of the growing layer to make the cross sectional shape of the growing layer trapezoidal, and the occurrence of such a facet can be suppressed by modifying the growing condition. In this case, the collector/base junction capacitance can be reduced by disposing only the silicon oxide film of a low dielectric constant. Accordingly, high speed operation at a low power consumption is made possible by the reduction of the parasitic capacitance.

Since other constitutions are identical to those in the embodiment shown in FIG. 12, a detailed explanation will be omitted.

Embodiment 10

Figure 15:
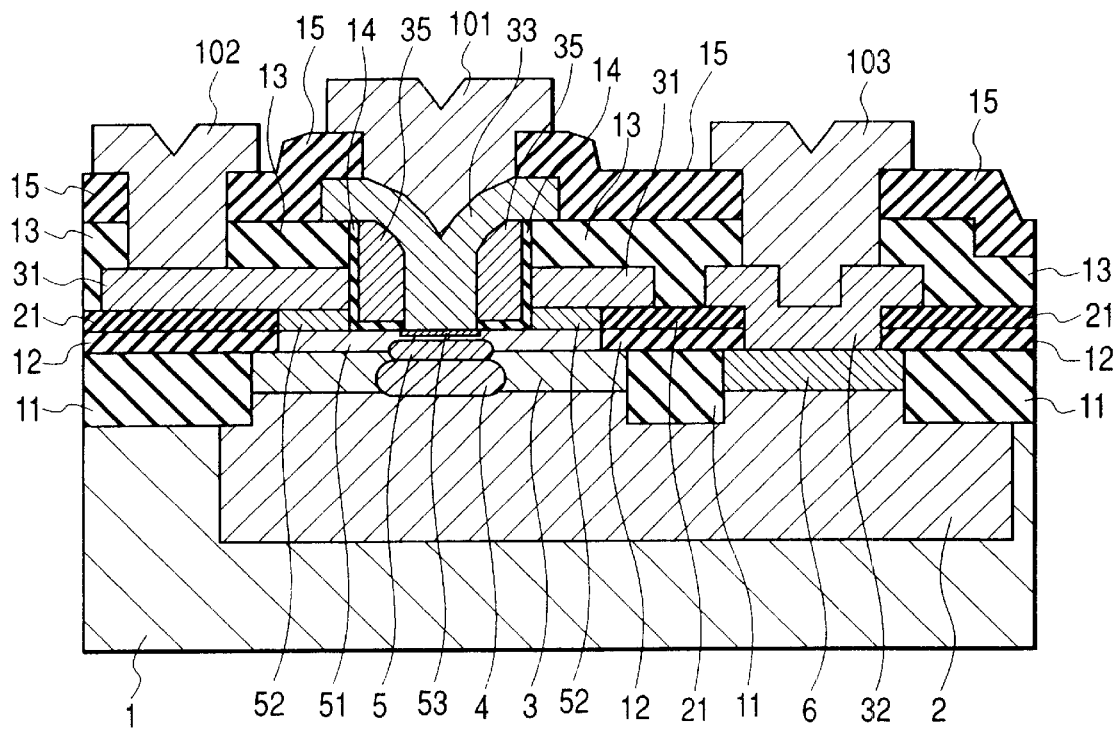
FIG. 15 is a cross sectional view illustrating a tenth embodiment of a bipolar transistor according to the present invention.

FIG. 15 is a cross sectional, structure view illustrating a tenth embodiment of a bipolar transistor according to the present invention.

This embodiment has a structure in which a single crystal silicon/germanium layer 51, described for Embodiments 1 to 6 is disposed only in the openings of insulating films 12 and 21, and a base lead electrode 31 comprising polycrystal silicon and the single crystal silicon/germanium layer 51 are in contact with each other by way of an extrinsic base 52. Various constitutions explained for Embodiments 1 to 6 can be used for the single crystal silicon/germanium layer 51.

Further, in this embodiment, the openings of the insulating films 12 and 21 are determined in a self-aligned manner relative to the designed emitter region 53 and, since the area of junction between the single crystal silicon/germanium layer 51 and the low concentration collector region 3 is made smaller, the collector/base junction capacitance can be reduced. This is effective, in cooperation with the effect of the distribution of the germanium content in the single crystal silicon/germanium layer 51 of the present invention, for increasing the operation speed and reducing the power consumption of the semiconductor device.

In this embodiment, the emitter/base isolation is constituted with a silicon oxide film 14 and a polycrystal silicon layer 35. As the width of the emitter region is narrowed, the width of a high concentration n-type polycrystal silicon layer 33, that is, the emitter electrode is also reduced in order to increase the resistance to the same level as an electrode 101, which increases the emitter series resistance which results in a problem in the transistor operation. The polycrystal silicon layer 35 in this embodiment is disposed for overcoming this problem and, when it is previously formed as a high concentration n-type, it is further effective for reducing the resistance. Accordingly, in the bipolar transistor according to the present invention, high speed operation is enabled by the reduction of the parasitic resistance.

The bipolar transistor of this embodiment can be easily formed by modifying the manufacturing method described for Embodiment 8 such that the polycrystal silicon layer 35 is deposited and patterned after the deposition of the insulating film 14.

Since other constitutions are identical to those in the embodiment shown in FIG. 9, detailed explanations thereof will be omitted.

Embodiment 11

Figure 16:
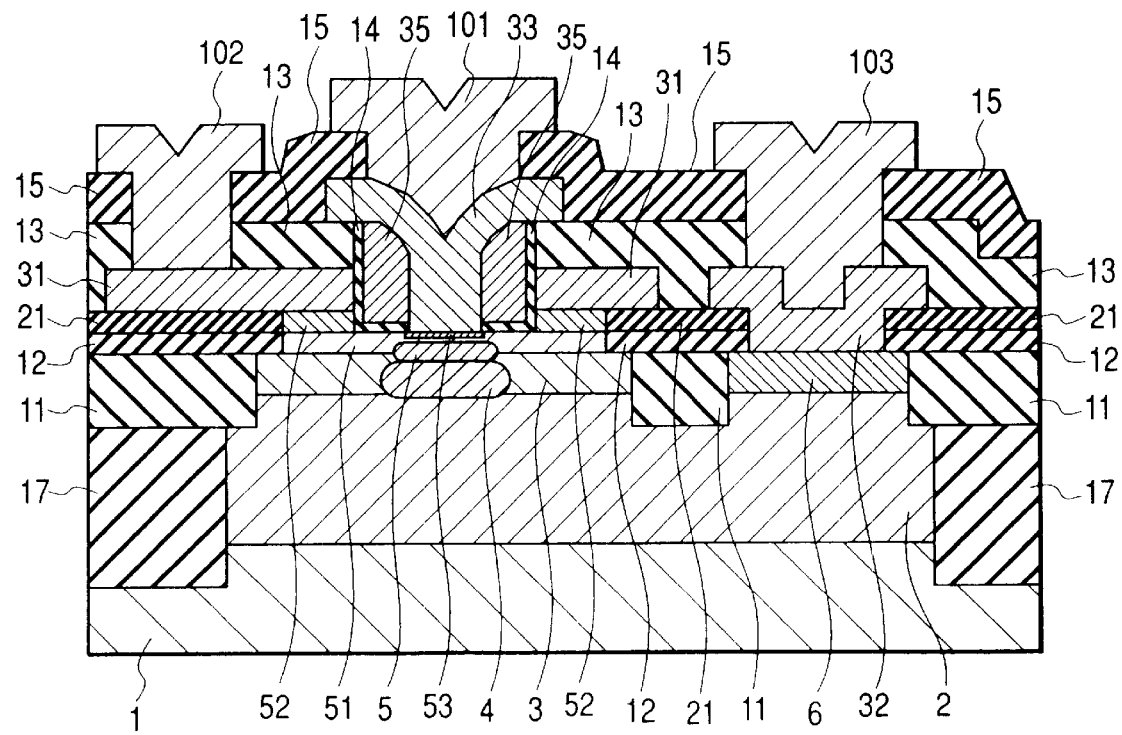
FIG. 16 is a cross sectional view illustrating an eleventh embodiment of a bipolar transistor according to the present invention.

FIG. 16 is a cross sectional, structural view illustrating the eleventh embodiment of a bipolar transistor according to the present invention.

This embodiment has a structure in which a single crystal silicon/germanium layer 51 described for Embodiments 1 to 6 is disposed only in the opening of insulating films 12 and 21, and a base lead electrode 31 comprising polycrystal silicon and the single crystal silicon/germanium layer 51 are in contact with each other by way of an extrinsic base 52. The openings of the insulating films 12 and 21 are determined in a self-aligned manner relative to the designed emitter region 53 and, since the area of junction between the single crystal silicon/germanium layer 51 and the low concentration collector region 3 is made smaller, the collector/base junction capacitance can be reduced. This is effective, in cooperation with the effect of the distribution of the germanium content in the single crystal silicon/germanium layer 51 of the present invention, for increasing the operation speed and reducing the power consumption of the semiconductor device.

In this embodiment, the device isolation is constituted by the silicon oxide films 11 and 17. The collector/substrate parasitic capacitance can be reduced by eliminating the junction of the lateral side of the high concentration n-type buried layer 2 in the collector region, and the p-type silicon substrate 1 is eliminated by the silicon oxide film 17. Accordingly, in the bipolar transistor according to the present invention, high speed operation is made possible by reducing the parasitic capacitance. The bipolar transistor of this embodiment can be easily formed by adding a step of forming the device isolation insulating film 17 before or after forming the device isolation insulating film 11.

Since other constitutions are identical to those in the embodiment shown in FIG. 15, detailed explanations thereof will be omitted.

Embodiment 12

Figure 17:
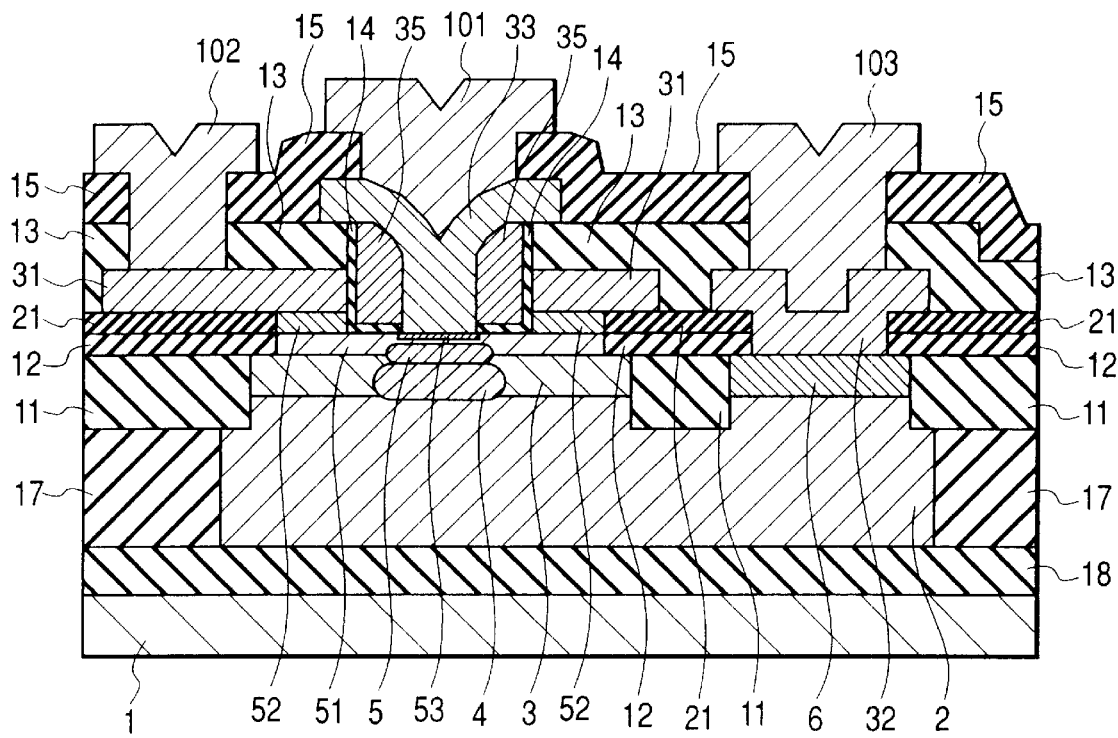
FIG. 17 is a cross sectional view illustrating a twelfth embodiment of a bipolar transistor according to the present invention.

FIG. 17 is a cross sectional structural view illustrating the twelfth embodiment of a bipolar transistor according to the present invention.

This embodiment has a structure in which a single crystal silicon/germanium layer 51, described for Embodiments 1 to 6 is disposed only in the openings of insulating films 12 and 21, and a base lead electrode 31 comprising polycrystal silicon and the single crystal silicon/germanium layer 51 are in contact with each other by way of an extrinsic base 52. The openings of the insulating films 12 and 21 are determined in a self-aligned manner to the designed emitter region 53 and, since the area of junction between the single crystal silicon/germanium layer 51 and the low concentration collector region 3 is made smaller, the collector/base junction capacitance can be reduced. This is effective, in cooperation with the effect of the distribution of the germanium content in the single crystal silicon/germanium layer 51 of the present invention, for increasing the operation speed and reducing the power consumption of the semiconductor device.

In this embodiment, a silicon substrate 1 also having a silicon oxide film 18 is used, by which the transistor is 25 completely isolated from other transistors with silicon oxide films is 11, 17 and 18. As a result, the junction of the bottom of the high concentration n-type buried layer 2 and the silicon substrate 1 in the collector region is eliminated by the silicon oxide film 18, and the collector/substrate parasitic capacitance can be reduced. Further, since the transistor is subjected to complete device isolation from the silicon substrate 1, interference with adjacent transistors can be reduced, and unnecessary noises from transistors of different operations can be suppressed. Accordingly, the bipolar transistor according to the present invention can operate at a high speed with a low power consumption as a result of the reduction of the parasitic capacitance, and can provide a high performance integrated circuit at high frequency.

Since other constitutions are identical to those in the embodiment shown in FIG. 16, detailed explanations thereof will be omitted.

Embodiment 13

Figure 18:
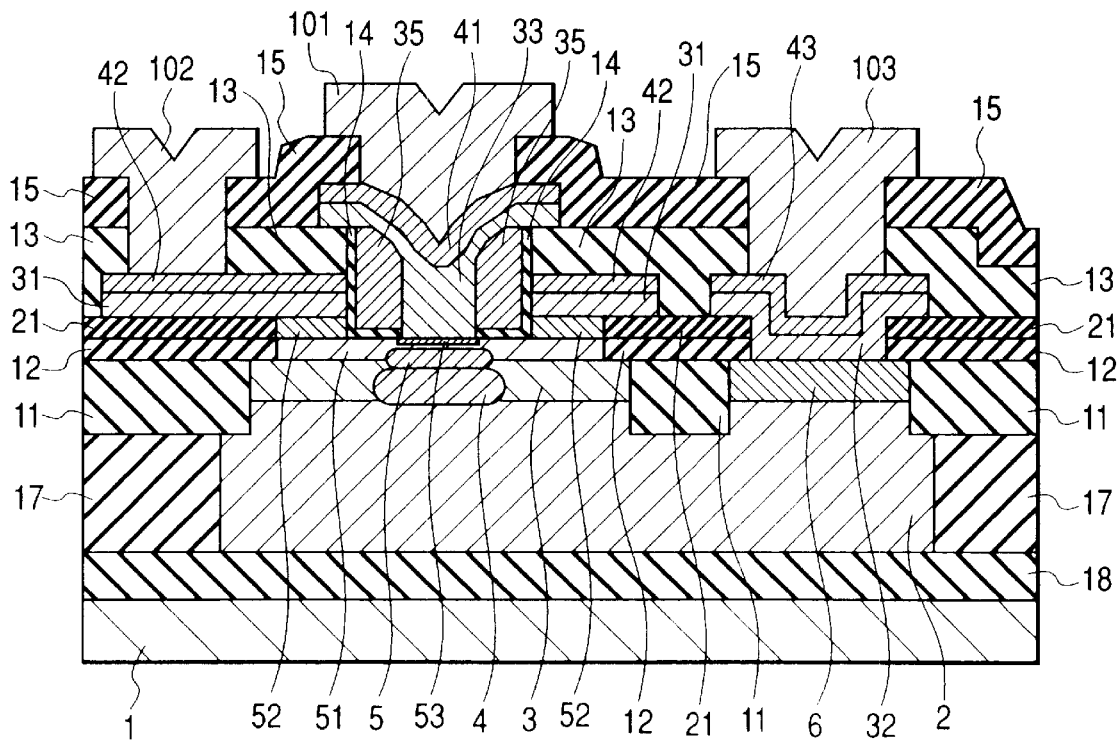
FIG. 18 is a cross sectional view illustrating a thirteenth embodiment of a bipolar transistor according to the present invention.

FIG. 18 is a cross sectional structural view illustrating a thirteenth embodiment of a bipolar transistor according to the present invention.

This embodiment has a structure in which a single crystal silicon/germanium layer 51, described for Embodiments 1 to 6, is disposed only in the openings of insulating films 12 and 21, and a base lead electrode 31 comprising polycrystal silicon and the single crystal silicon/germanium layer 51 are in contact with each other by way of an extrinsic base 52 comprising polycrystal silicon/germanium. The openings of the insulating films 12 and 21 are determined in a self-aligned manner relative to the designed emitter region 53 and, since the area of junction between the single crystal silicon/germanium layer 51 and the low concentration collector region 3 is made smaller, the collector/base junction capacitance can be reduced. This is effective, in cooperation with the effect of the distribution of the germanium content in the single crystal silicon/germanium layer 51 of the present invention, for increasing the operation speed and reducing the power consumption of the semiconductor device.

In this embodiment, silicide films (reaction films of silicon and metal) or metal films 41, 42 and 43 are disposed on a p-type polycrystal silicon layer 31 as a base lead electrode, on a high concentration n-type polycrystal silicon layer 32 as a collector electrode, and on a high concentration n-type polycrystal silicon layer 33 as an emitter electrode in a self-aligned manner. They can reduce the contact resistance between each of the polycrystal silicon layers and electrodes 101, 102 and 103 to lower the series resistance. The bipolar transistor according to the present invention enables high speed operation by the reduction of the parasitic resistance.

Also, when etching insulating films of different thicknesses upon forming contact holes in portions for disposing the electrodes 101, 102 and 103, since the silicide films (reaction films of silicon and metal) or the metal films 41, 42, 43 function as etching stoppers, a transistor can be manufactured more stably. Each of the silicide films (reaction films of the silicon and metal) or metal films can be formed easily by depositing a metal film after exposing the polycrystal silicon layer, reacting the film with silicon and then removing an excess portion, or by selectively depositing the metal film on the polycrystal silicon layer.

Since other constitutions are identical to those in the embodiment shown in FIG. 17, detailed explanations thereof will be omitted.

An embodiment of an optical transmission system according to the present invention will now be explained.

Embodiment 14

Figure 19:
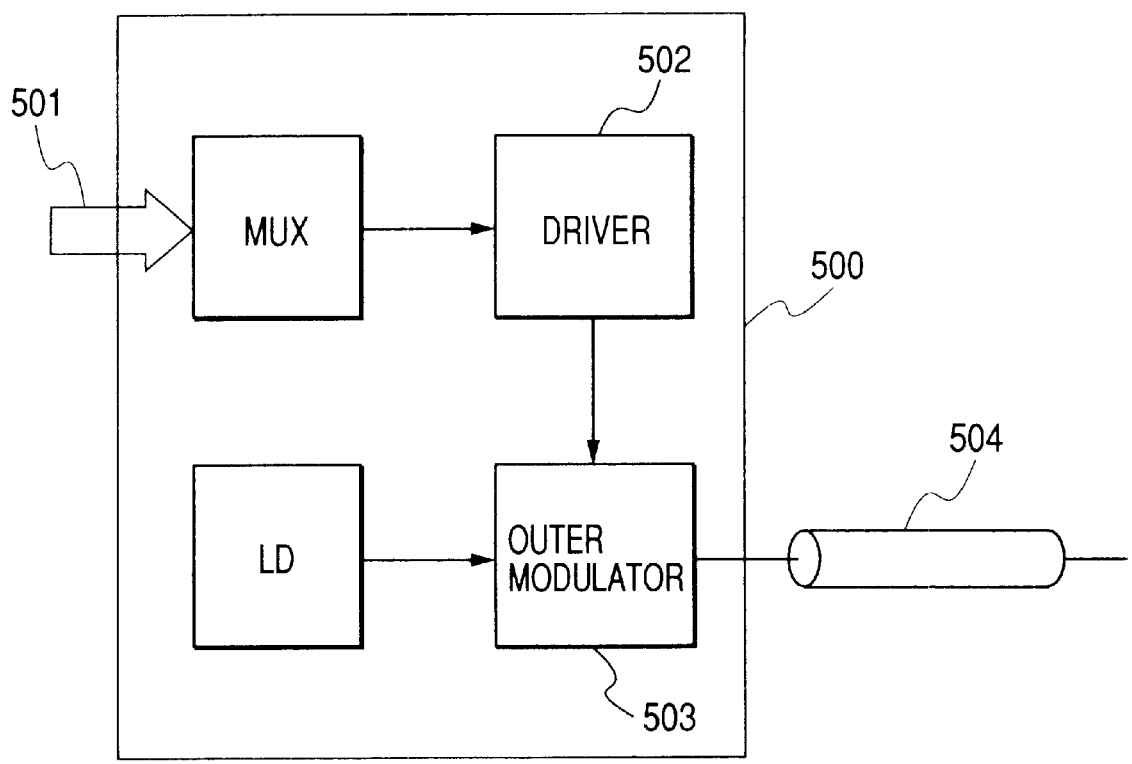
FIG. 19 is a block diagram of a transmission module to which a bipolar transistor according to the present invention, is applied.
Figure 20:
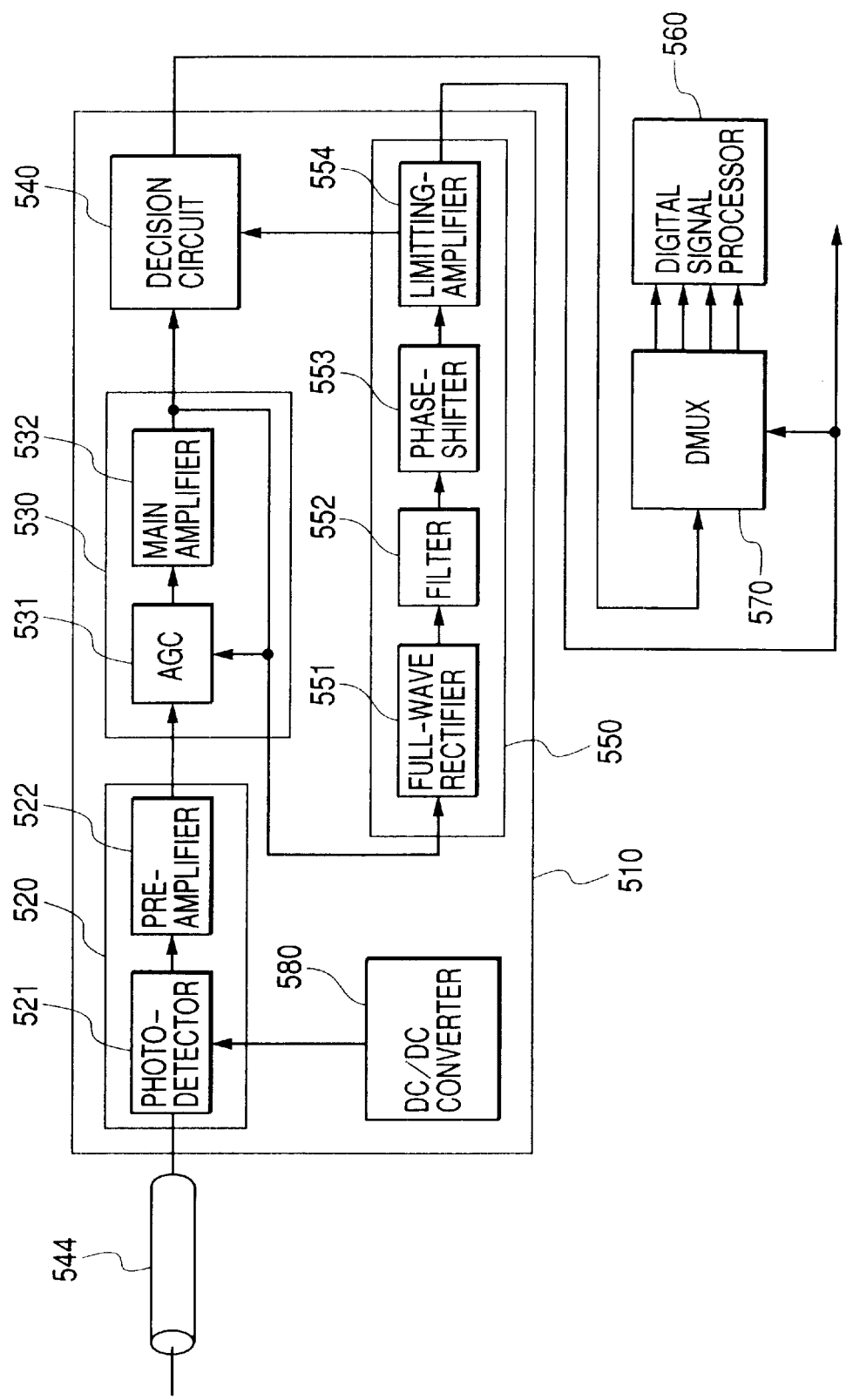
FIG. 20 is a block diagram of a receiving module to which a bipolar transistor, according to the present invention, is applied.

FIG. 19 and FIG. 20 are block diagrams respectively illustrating a fourteenth embodiment of a bipolar transistor according to the present invention. These diagrams are constitutional views for an optical transmission system. FIG. 19 shows a schematic constitution of an optical transmission module, and FIG. 20 shows a schematic constitution of an optical receiving module of the optical transmission system.

It is well-known that a transmission speed has t to be increased in order to construct a large capacity optical transmission system. High speed operation is then required for the bipolar transistors used in integrated circuits constituting the system. Accordingly, the performance of the integrated circuits as well as the entire system can be improved remarkably by adopting the transistors according to the present invention as the transistors used in the integrated circuits constituting the system.

FIG. 19 shows a transmission module 500 for the optical transmission system. Electric signals 501 to be transmitted are inputted into a multiplexer MUX and then multiplied, for example, as 4:1 and output signals therefrom are transmitted to a driver 502. A semiconductor laser LD always outputs a light at a constant intensity, and an external modulator 503, driven by the driver 503, is adapted to absorb or not to absorb a light, depending on the output of the driver 502, and transmit the same to an optical fiber 504. The transmission module shown in FIG. 19 is a so-called external modulation type which may be replaced with a direct modulation type of directly controlling emission from the semiconductor laser LD, but transmission on the external modulation type suffers from a lack of extension of spectral oscillation and is suitable to high speed and long distance transmission.

FIG. 20 shows an optical receiving module 510 of the optical transmission system. In FIG. 20, reference numeral 520 denotes a front end module, and the front end module 520 comprises a photodetector 521 for receiving optical signals transmitted through an optical fiber 544 and a preamplifier 522 for amplifying output from the photodetector. Electrical signals amplified by the preamplifier 522 are inputted and amplified in a main amplifier portion 530. The main amplifier portion 530 is constituted such that the output of the main amplifier 532 is fed back and inputted into an automatic gain controller AGC. Further, the main amplifier portion 530 can adopt a limit amplifier for limiting the output amplitude in addition to the constitution of adjusting the gain. A decision circuit 540 is adapted for 1 bit analog-to-digital conversion in synchronization with a predetermined clock to conduct, in which the output from the main amplifier portion 530 is digitalized and separated by a demultiplexer DMUX 570, for example, to 1:4, which is then inputted into a digital signal processor 560 in the succeeding stage and subjected to a predetermined treatment.

A clock extractor 550 is used for forming clock signal for controlling the operation timing of the decision circuit 540 and the demultiplexer DMUX 570 from converted electrical signals, in which the output from the main amplifier portion 530 is rectified by a full wave rectifying 551 and filtered by a band-filter 552 to extract signals as clock signals. Output from the filter 552 is inputted into a phase-shifter 553. The phase-shifter 553 is for the alignment of the phases between the filter output and the analog signals, which delay the filter output based on a predetermined amount of delay. Output from the phase shifter 553 is inputted by way of the limit amplifier 554 into the decision circuit 550 and the demultiplexer DMUX 570.

Figure 21:
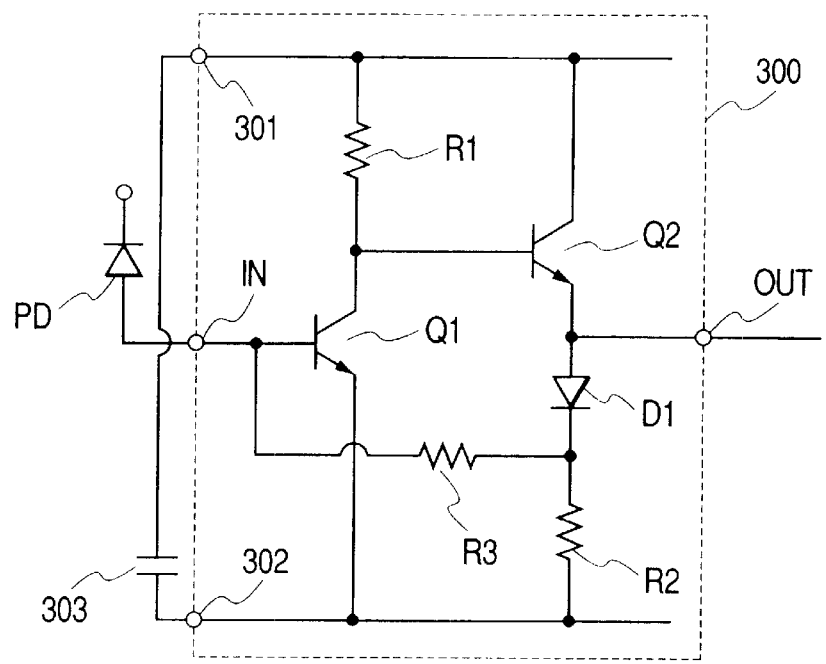
FIG. 21 is a circuit diagram of a pre-amplifier circuit suitable for application of a bipolar transistor according to the present invention used for a receiving module.

FIG. 21 shows a circuit diagram for a preamplifier circuit as an example of an integrated circuit constituting the system. A particularly high speed operation is required for the preamplifier circuit. Accordingly, the performance for the entire amplifier circuit can be improved remarkably by adopting the transistor according to the present invention as the transistor for constituting the amplifier circuit. In FIG. 21, reference numeral 300 denotes a semiconductor integrated circuit constituting the preamplifier circuit formed on a single semiconductor substrate, in which a photo-diode PD is externally attached to the input terminal IN, and a decoupling capacitor 303 is attached externally between a power source terminal 301 and a ground terminal 302 of the semiconductor integrated circuit 300. The photo-diode PD is a photodetector for receiving optical signals transmitted through an optical transmission cable, and a decoupling capacitor 303 is a capacitor for short circuiting AC components between a power source line and a grounding line.

Bipolar transistors Q1 and Q2 are bipolar transistors constituting the amplifier circuit for which any of the bipolar transistors according to the present invention having the structure as explained for Embodiments 1 to 13 can be used suitably. A diode D1 is a diode for level shifting, which may be formed by short circuiting the base and the collector of the bipolar transistor according to the present invention or, if necessary, a plurality of diodes may be applied by connecting them directly, if necessary. Further, an output buffer circuit may be inserted optionally between the output terminal OUT and emitter of the transistor Q2.

In the semiconductor integrated circuit 300 constituting the preamplifier circuit for use in the optical transmission system according to this embodiments, electrical signals converted from optical signals transmitted through an optical transmission cable by the photo-diode PD are inputted to the input terminal IN, and the inputted electrical signals are amplified by amplifying transistors Q1 and Q2 and outputted from the output terminal OUT. By using any of the bipolar transistors according to the present invention as explained for the Embodiments 1 to 13, the preamplifier circuit in this embodiment can attain a wide band characteristic.

Figure 22:
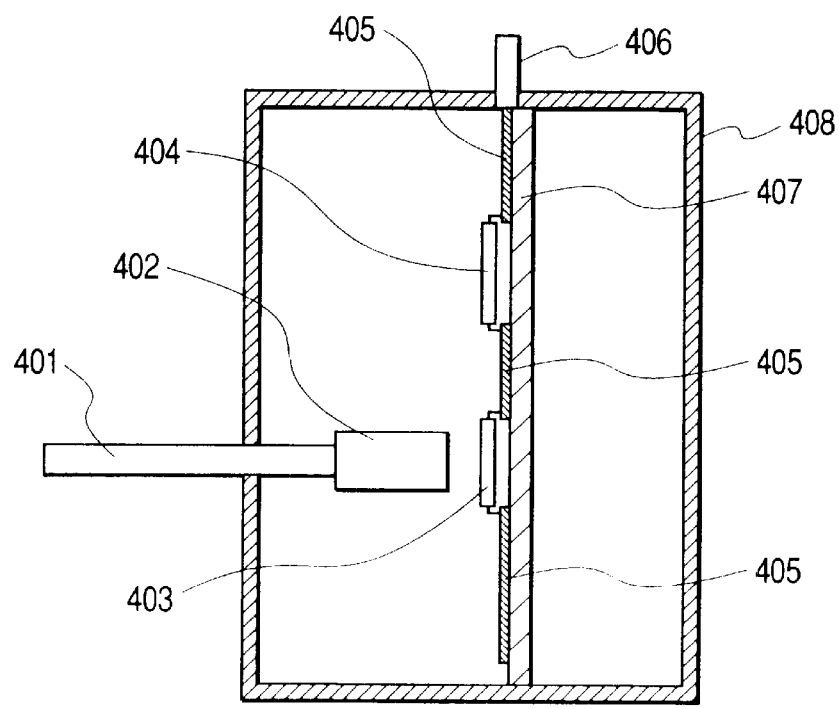
FIG. 22 is a cross sectional view of a front end module of an optical transmission system in which a pre-amplifier circuit applied with a bipolar transistor, according to the present invention, is integrated on a mounting substrate.

FIG. 22 shows a cross sectional view of a front end module of an optical transmission system in which the photo-diode PD and the preamplifier circuit are integrated onto a mounting substrate. FIG. 22 shows an optical fiber 401, a lens 402, a photo-diode 403, and a semiconductor integrated circuit 404, in which the preamplifier is formed. The photo-diode 403 and the preamplifier IC 404 are mounted on the substrate 407, and the photo-diode 403 and the preamplifier IC 404 are connected by way of wirings 405 for connecting the diode and the amplifier to an output terminal 406. Further, the substrate 407 is housed in a hermetic seal package 408, such as a metal casing. Although not illustrated, the capacitor 403, shown in FIG. 21, is also mounted on the substrate 407. By constituting the photo-diode and the preamplifier constituting the front end in one identical module, the signal path can be shortened and noises can be made less intrusive, so that the parasitic inductor component and the capacitance component can also be kept lower.

In the front module shown in FIG. 22, optical signals inputted from the optical fiber 401 are condensed through the lens 402 and converted by the photo-diode 403 into electric signals. The electric signals are amplified through wirings 405 on the substrate 407 in the preamplifier IC 404, and then outputted from the output terminal 406.

In the optical communication system described here, the circuit can be constituted by using the bipolar transistors according to the present invention of the constitution described for previous Embodiment 1 to 13 in each of the 25 portions of the system. Further, the circuit constituting the main amplifier 532 can also be constituted by the circuit shown in FIG. 21.

Further, since the collector current can be designed at high accuracy and the collector current varies less in the transistor according to the present invention, the signal voltage for the circuit can be set low, thereby enabling an increase in the operation speed and a decrease in the power consumption of the circuit. Particularly, it is effective for the multiplexer MUX, the decision circuit 540, or the DMUX 570 in the transmission module 500 having a number of integrated devices and, further, for the automatic gain controller 501 requiring transistors capable of operating. with high accuracy.

The bipolar transistor according to the present invention, manufactured in accordance with the embodiments described above, enables high speed operation, for example, at a cutoff frequency and the highest cutoff frequency of 100 GHz, so that large capacity signals of 40 Gbits per one sec can be transmitted/received at high speed. Further, it has been necessary so far for those circuits requiring such high speed operation to use GaAs transistors of higher operation speed, as compared with silicon bipolar transistors. However, since inexpensive silicon bipolar transistors according to the present invention can be used for such circuits, the cost for the entire optical transmission system can be minimized.

Embodiment 15

Figure 23:
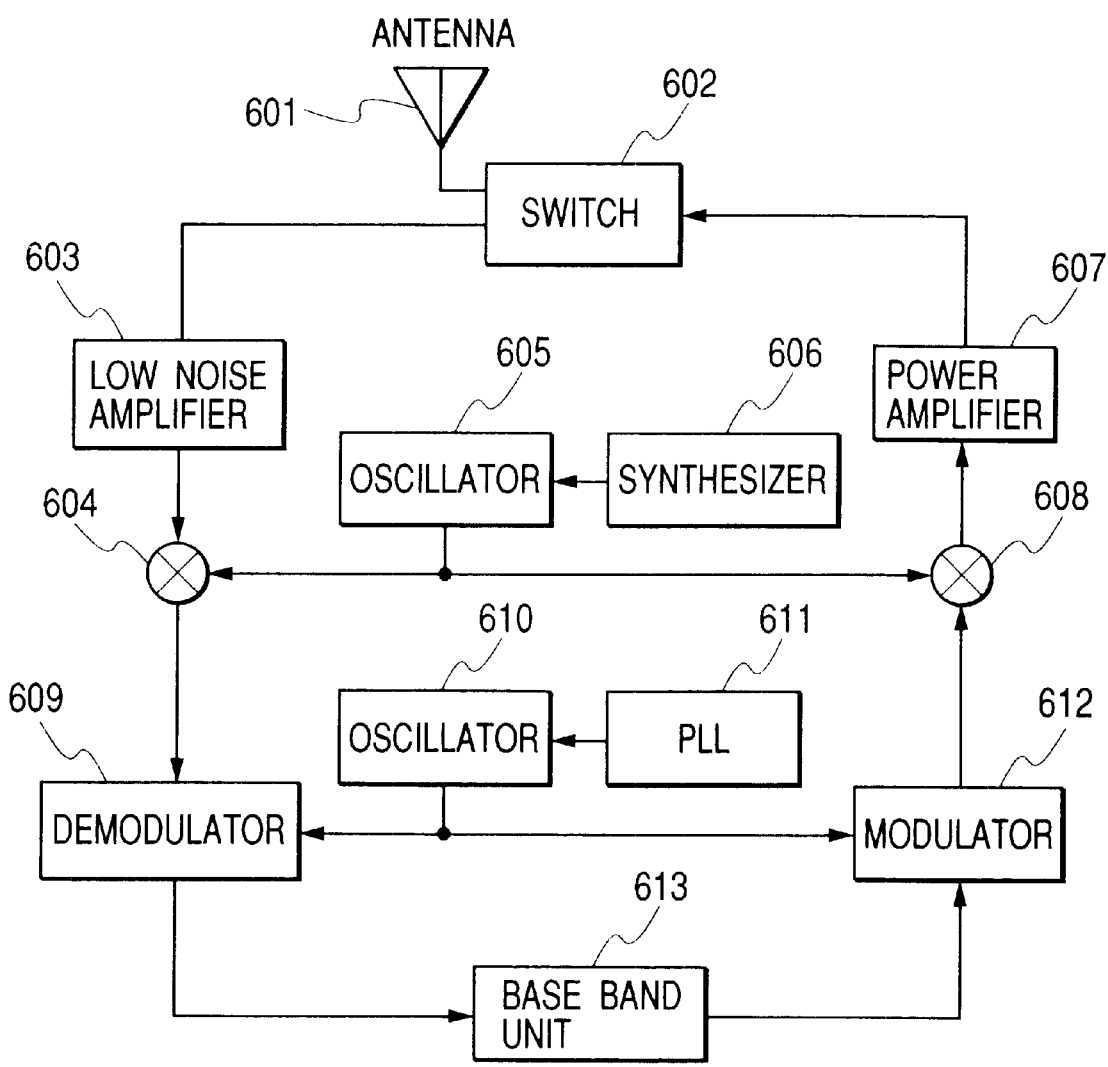
FIG. 23 is a constitutional block diagram of a mobile wireless portable unit to which a bipolar transistor, according to the present invention, is applied.

FIG. 23 is a view illustrating a fifteenth embodiment of a bipolar transistor according to the present invention, which is a block diagram for a mobile wireless portable unit to which the bipolar transistor according to the present invention is applied. In this embodiment, the bipolar transistor according to the present invention as explained for Embodiments 1 to 13 is applied to circuits constituting the blocks of a mobile wireless portable unit such as a low noise amplifier 603, a synthesized 606 and a PLL (Phase Locked Loop) 611.

The mobile wireless portable unit in this embodiment, shown in FIG. 23, is operated as described below. An input from an antenna 601 is amplified through the low noise amplifier 603, while a frequency generated from the synthesizer 606 is oscillated from an oscillator 605, and signals from the low noise amplifier 603 are down converted by a down mixer 604 into a lower frequency by using the signals oscillated from the oscillator 605. Further, a frequency generated from the PLL 611 is oscillated from an oscillator 610, and signals from the down mixer 604 are demodulated by a demodulator 600 using signals oscillated from the oscillator 610, and used for signal processing in a base band unit 613 processing lower frequency. Further, signals generated from the base band unit 613 are modulated by a modulator 612 using signals from the PLL 611 and, subsequently, up-converted into a high frequency based on the signals from the synthesizer 606 in an up-mixer 608, and then amplified by a power amplifier 607 and transmitted from the antenna 601. A switch 602 is adapted to switch between transmission and reception, and controls transmission/reception under the control signals, not illustrated, from the base band unit 613. Further, the speaker or the microphone, also not illustrated, are connected with the base band unit 613, thereby enabling input/output of voice signals.

It is effective to apply any of the bipolar transistors according to the present invention, explained for Embodiments 1 to 13, to each of the blocks shown in FIG. 23, which constitute the mobile wireless portable unit of this embodiment, particularly, to the block of the low noise amplifier 603, the synthesizer 606, the PLL 611, the down mixer 604, the up mixer 608, the oscillators 605 and 610 and the power amplifier 607 to constitute each of the circuits. Since the base resistance and the collector/base capacitance can be reduced in the transistor according to the present invention, it is possible to reduce the noise and reduce the power consumption in the low noise amplifier 603, the synthesizer 606 and the PLL 611. This results in a low noise mobile wireless portable unit for the entire system and which is usable for a long time.

Figure 24:
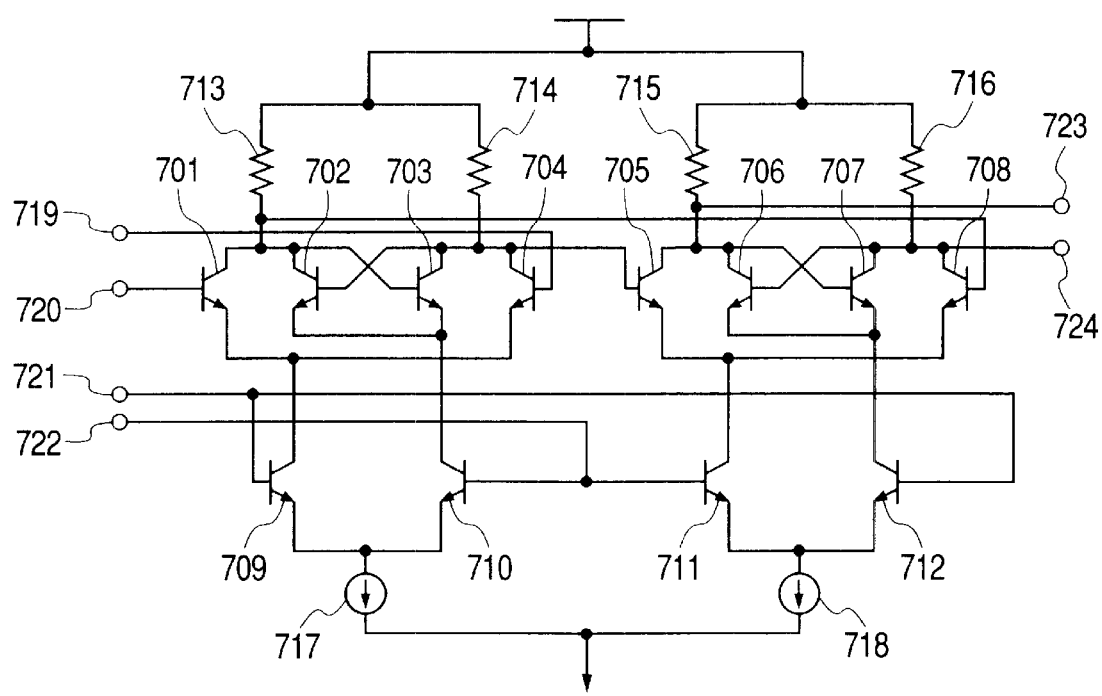
FIG. 24 is a circuit diagram of a D flip-flop for a pre-scaler suitable for PLL of a mobile wireless portable unit to which a bipolar transistor, according to the present invention, is applied.

FIG. 24 shows a circuit diagram for a D flip-flop for a prescaler of PLL as an example of an integrated circuit constituting the system. This is an example of using the transistor according to the present invention described with reference to the previous Embodiments 1 to 13 for transistors 801 to 712 on the circuit shown in FIG. 24.

Input signals, clock signals and output signals of the D-flip-flop circuit have only the two states of high potential and low potential. The input signals and inverted input signals are inputted to a terminal 719 and a terminal 720 respectively, and the clock signals and inverted clock signals are inputted to a terminal 721 and a terminal 722, respectively, to obtain output signals and inverted output signals from a terminal 723 and terminal 724, respectively. Current paths flowing through the current sources 718 and 719 are switched, respectively, to one of transistors 709 or 710 or one of the transistors 711 or 712 by the clock signals. In this circuit, the output signals are at the input value when the, clock signal changes from the low potential to the high potential and hold the input value when the clock signal changes from high potential to low potential.

Embodiment 16

Figure 27:
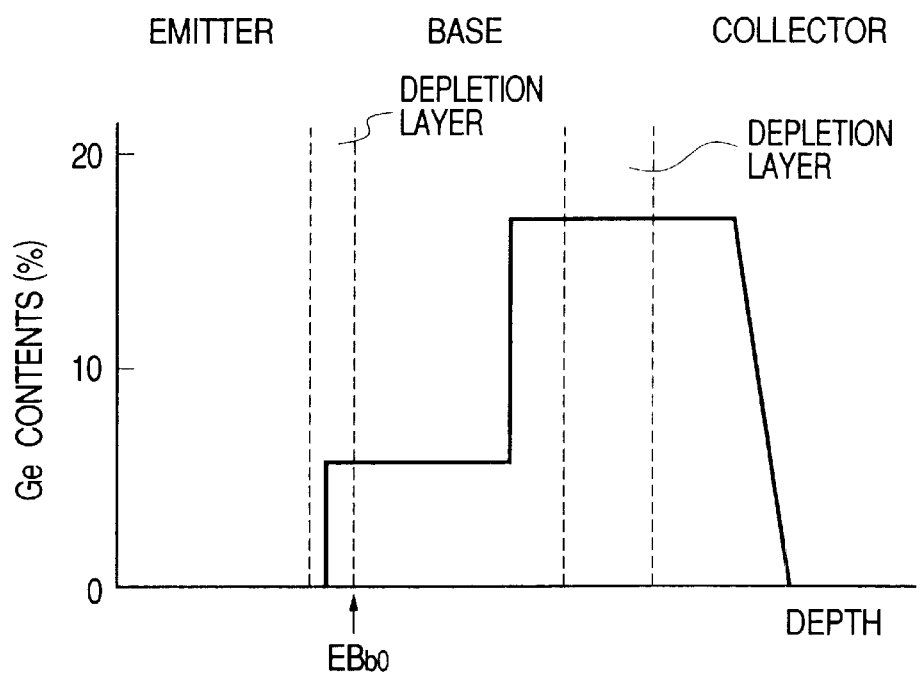
FIG. 27 is a distribution diagram of a germanium content showing another embodiment of a bipolar transistor according to the present invention.

FIG. 27 is a distribution diagram of germanium illustrating a sixteenth embodiment of a semiconductor device according to the present invention. The abscissa denotes the depth in the crystal body and the ordinate denotes the germanium content (%). The diagram shows each of the regions of the emitter, base and collector, and each of the regions of the depletion layers at each junction region. A solid polygonal line in FIG. 27 shows an example of the germanium distribution in the regions.

In this embodiment, regions in which the germanium content increases toward the collector are disposed stepwise in the base region, and the band gap is decreased toward the collector, as in other embodiments, to form an electric field in the base layer, thereby enabling acceleration of electrons in the base layer and an increase of the operation speed. Further, since the collector current is controlled by the electric field in the base layer, it is possible to obtain a good characteristic that the collector current does not change substantially even when the collector voltage is changed.

In this embodiment, the germanium content on the side of the collector can be changed in accordance with the manner in the various examples described above. Examples are shown, for example, in FIG. 1, FIG. 4 or FIG. 5.

Embodiment 17

Figure 28:
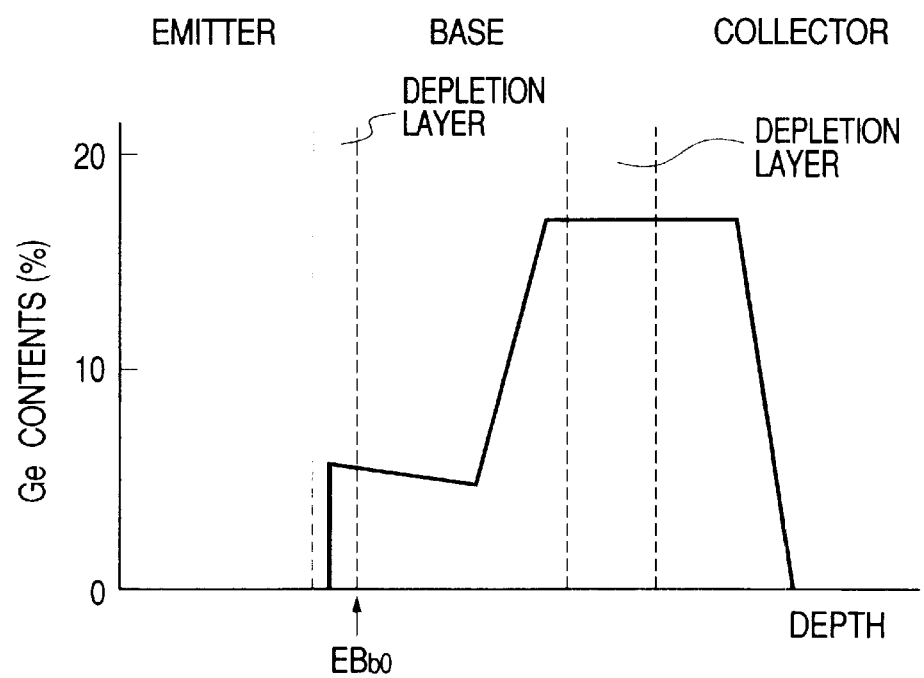
FIG. 28 is a distribution diagram of a germanium content showing another embodiment of a bipolar transistor according the present invention.

FIG. 28 is a distribution diagram of germanium illustrating a seventeenth embodiment of a semiconductor device according to the present invention. The abscissa denotes the depth in the crystal body and the ordinate denotes the germanium content (%). The diagram shows each of the regions of the emitter, base and collector, and each of the regions of the depletion layers at each junction region. A solid polygonal line in FIG. 28 shows an example of the germanium distribution in the regions.

In this embodiment, a region where the germanium content is decreased and a region where it is increased toward the collector are disposed in the base region. As described above with reference to FIG. 3, if the region for the constant germanium content is decreased excessively, the fluctuation of the on voltage can not be suppressed. This is because the integration amount of the carriers changes to the fluctuation of the end position EBb0 of the depletion layer for the emitter/base junction on the side of the base. Therefore, it is necessary that a region be provided where the germanium content is constant at about 5 m or more. However, this condition is an inhibitive factor when the thickness of the layer is reduced for the purpose of high speed operation performance.

In this embodiment, the integration amount of the carriers can be kept constant relative to the fluctuation of the end position EBb0 of the depletion layer for the emitter/base junction on the side of the base. Further, since the content change in the region where the germanium content is decreased is more moderate, compared with the region where the germanium content increases toward the collector, this gives no particular hindrance to the running of electrons in the base layer.

The extent of the decrease of the germanium content is determined such that the integration amount of the carriers is kept constant relative to the fluctuation of the end position EBB0 of the depletion layer for the emitter/base junction on the side of the base. It is often designed such that the germanium content change in the range where the germanium content is decreased is between approximately 1% to 5% in view of the fluctuation of the band gap.

In this embodiment, the germanium content on the side of the collector is in accordance with various examples described above. Examples are shown, for example, in FIG. 1, FIG. 4 or FIG. 5.

In this embodiment, as explained above, a bipolar transistor of high accuracy can be provided, and it is also possible to reduce the thickness of the layer for the entire base region and increase the operation speed.

Figure 29:
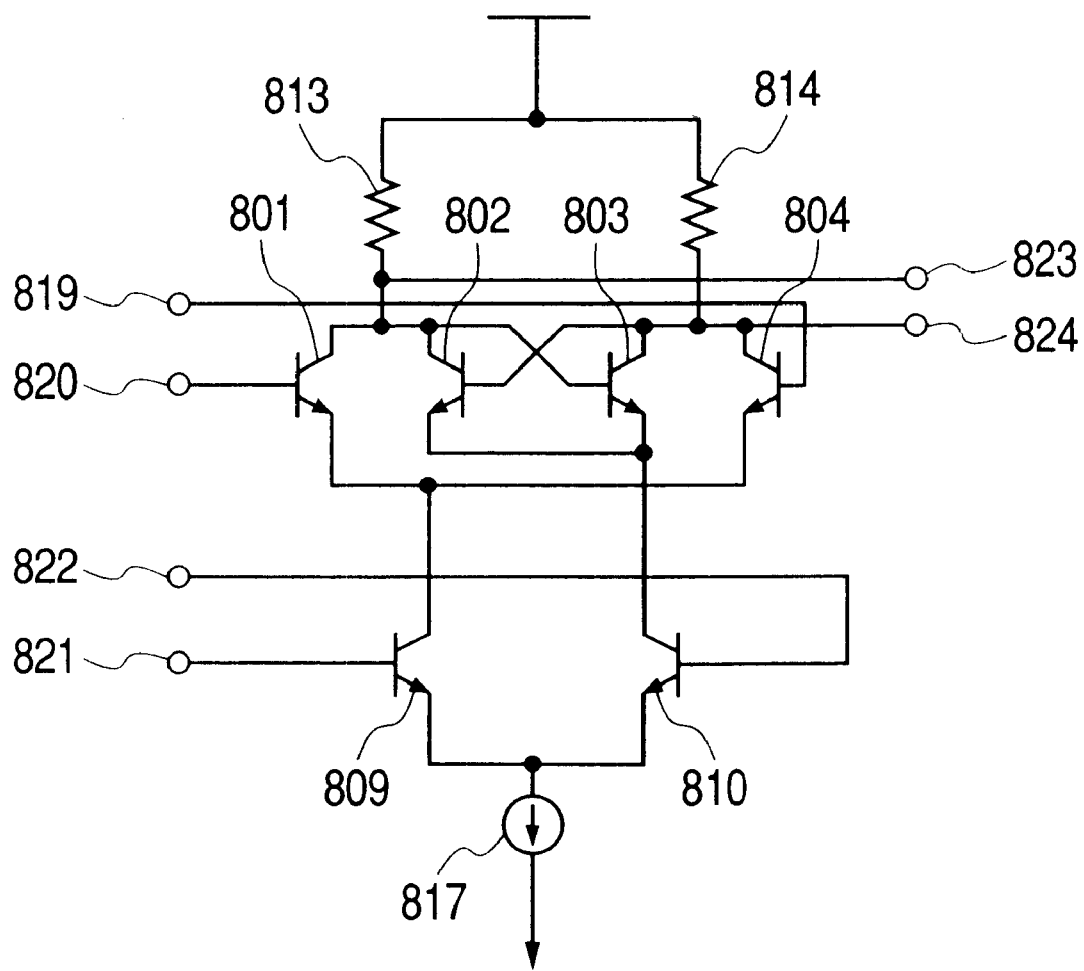
FIG. 29 is a circuit diagram for a differential amplifier of high accuracy to which a bipolar transistor, according to the present invention, is applied.

FIG. 29 shows a circuit diagram for a differential amplifier as an example of an integrated circuit requiring transistors of high accuracy. This is an example of using one of the bipolar transistors according to the present invention, explained with reference to Embodiments 1 to 15, for transistors 801 to 804, 809 and 810 in the circuit shown in FIG. 29. Other circuit connections are fundamentally the same as those of conventional differential amplifier circuits. Accordingly, detailed explanations are omitted.

In the differential amplifier circuit, if the on voltage of transistor pairs 801 and 804, 802 and 803 and 809 and 810, the emitters of which are connected to each other, do not agree, offset is caused in the output signals and no satisfactory operation can be attained. This problem can be avoided by using the transistor shown in the preferred embodiments, and it is possible to obtain excellent performance when applied to an analog operation circuit such as an operation amplifier or a mixer.

Then, an example of mounting a plurality of semiconductors together on one semiconductor substrate is shown. That is, this is an example of mounting semiconductor devices whose characteristics and structures are all in accordance with the design requirement.

Embodiment 18

Figure 30:
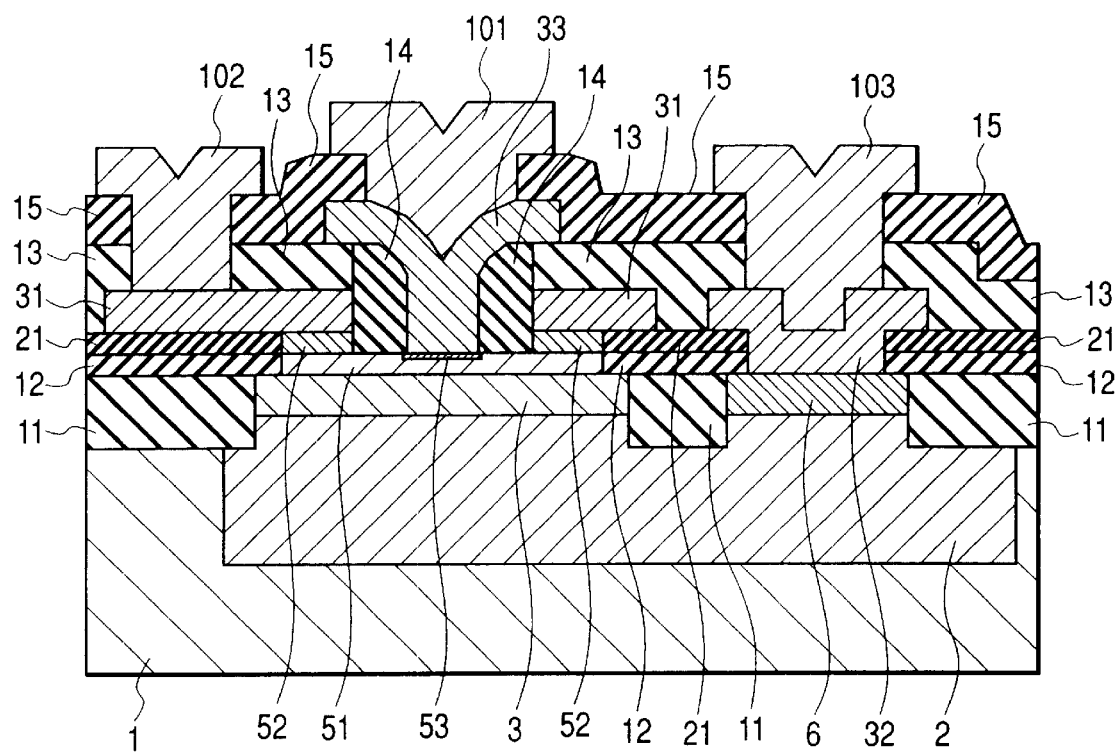
FIG. 30 is a distribution diagram of a germanium content showing another embodiment of a bipolar transistor according to the present invention.

FIG. 30 is a cross sectional structural view showing an eighteenth embodiment of a bipolar transistor according to the present invention.

The basic structure is identical to that shown in FIG. 9 as illustrating the seventh embodiment. In this embodiment, the collector region 4 is higher by about one digit than the low concentration collector region 3 and the collector region 5 at a carrier concentration that is about identical to that in the collector region 4, shown in FIG. 9 illustrating the seventh embodiment, is eliminated. This can provide a high withstand voltage characteristic.

Figure 31:
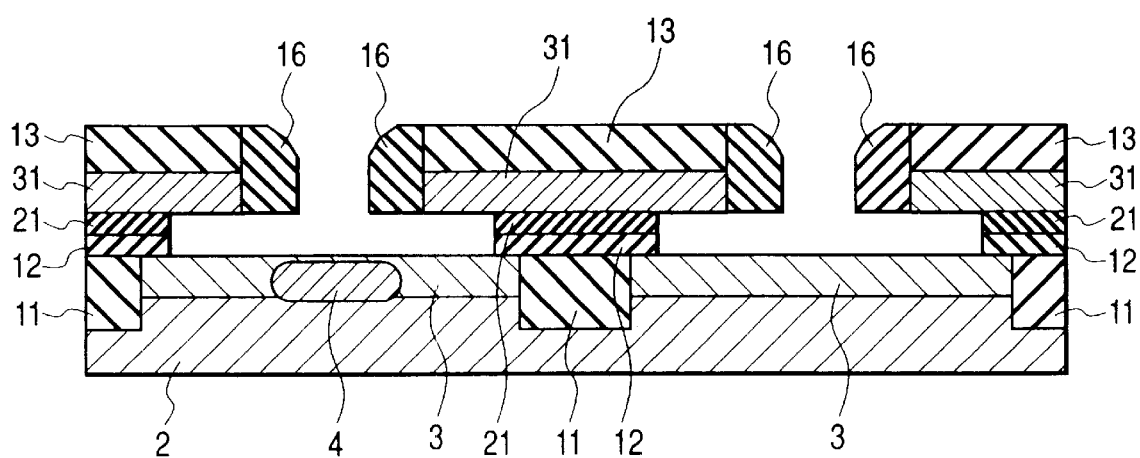
FIG. 31 is a fragmentary, enlarged cross sectional view illustrating a manufacturing method for a bipolar transistor of the present invention, shown in FIG. 9 and FIGS. 20 30.
Figure 32:
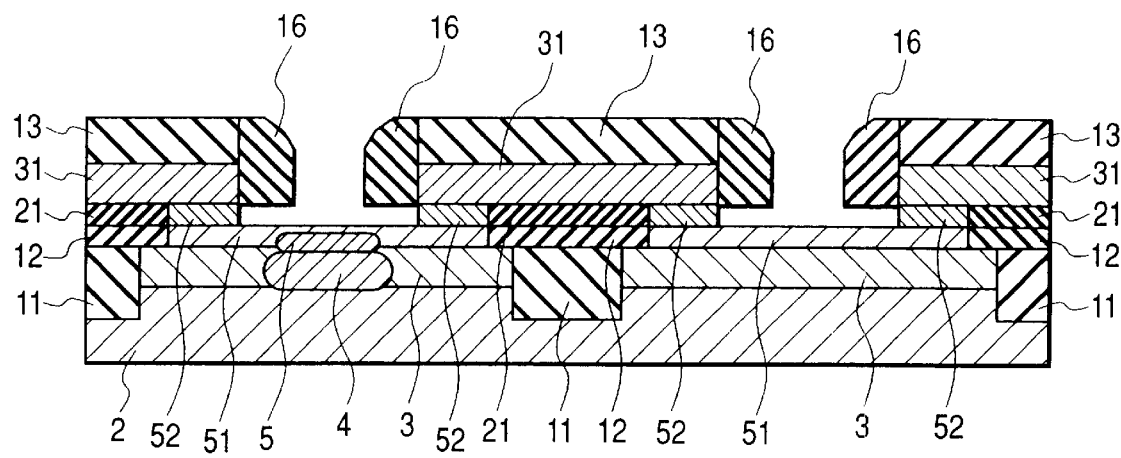
FIG. 32 is a fragmentary, enlarged cross sectional view illustrating a manufacturing method for a bipolar transistor of the present invention, shown in FIG. 9 and FIG. 30.
Figure 33:
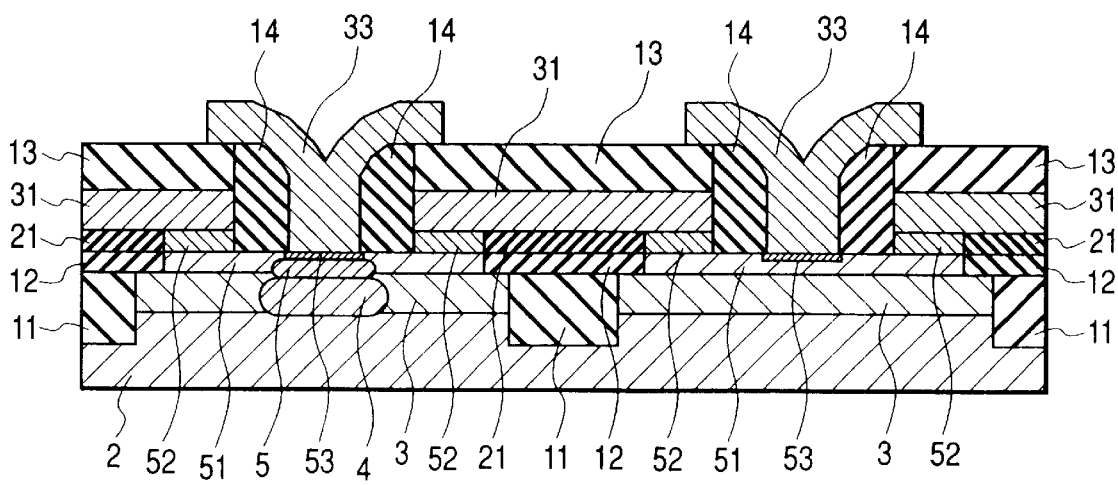
FIG. 33 is a fragmentary, enlarged cross sectional view illustrating a manufacturing method according to a bipolar transistor of the present invention, shown in FIG. 9 and FIG. 30.

The bipolar transistor of the structure shown in FIG. 30, and the manufacturing method of the bipolar transistor of the structure shown in FIG. 9, illustrating the seventh embodiment, described above will be explained with reference to FIGS. 31 to 33. FIGS. 31 to 33 are cross sectional views of the device shown in the order of the manufacturing steps. In the figures, the semiconductor substrate 1 is not illustrated, but the structure at or above the high concentration n-type buried layer 2 formed on the semiconductor substrate 1, shown in FIG. 30 is shown.

A low concentration n-type collector layer 3 is epitaxially grown over the entire surface of the p-type silicon substrate 1, formed with a high concentration n-type buried layer 2 to form a device isolation insulating film 11 comprising a silicon oxide film. Then, a collector/base isolation insulating layer 12 comprising a silicon oxide film, a collector/base isolative layer 21 comprising a silicon nitride film, a base electrode 31 comprising polycrystal silicon (or polycrystal silicon/germanium) and an emitter/base isolation insulating film 13 are formed.

Then, an emitter/base isolation insulating film 13 and an opening of a base lead electrode 31 are formed by a usual etching process to the laminate. After forming a second emitter/base isolation insulating layer 16 on the side wall of the first emitter/base isolation insulating film 13 and the base lead electrode 31, phosphorus is ion implanted by way of a photolithographic step in order to form a collector region 4 to the region of the opening only at the region not covered by the photolithographic step. Thus, the collector region 4 is formed for the transistor requiring high speed operation performance, while the collector region is not formed for the transistor requiring a high withstand voltage characteristic. The collector/base isolation insulating films 21 and 12 are etched by an isotropic etching (FIG. 31).

Then, a single crystal silicon/germanium layer 51 is formed on the low concentration n-type collector layer 3 by epitaxial growing. In this step, growing is conducted under the condition that the polycrystal silicon/germanium is not deposited on the first emitter/base isolation insulating film 13 and the second emitter/base isolation insulating film 16, by utilizing the difference between the growth start time of the single crystal silicon/germanium on the single crystal silicon and the growth start time of the polycrystal silicon/germanium on the insulating film.

Then, phosphorus is ion implanted into the semiconductor laminate structure, prepared as described above, to form a collector region 5 to the single crystal silicon/germanium region corresponding to a portion below the opening of the emitter/base-isolation insulating film 16, only in the region that is not covered by the photolithographic step. In this way, the collector region 5 is formed for the transistor requiring the high speed operation performance, and the collector region 5 is not formed for the transistor requiring the withstand voltage characteristic (FIG. 32).

Along with the growth of the single crystal silicon/germanium, an extrinsic base 52 comprising polycrystal silicon/germanium is formed to the protruding portion of the base lead electrode 31 and the lateral wall of the collector/base isolation insulating film 21. Then, when the thickness of the collector/base isolation insulating film 12 and 21, and the sum of the thickness for the single crystal silicon/germanium layer 51 and the polycrystal silicon/germanium layer 52 deposited below the protruding portion of the base lead electrode 31 become identical, the protruded portion is completely filled and the intrinsic base 51 and the base lead electrode 31 are connected by way of the extrinsic base 52.

Then, the emitter/base isolation insulating film 16 is removed by etching, and an emitter/base isolation insulating film 14 is formed to each of the side walls for the emitter/base isolation insulating film 13, the base lead electrode 31, and the extrinsic base 52 comprising polycrystal silicon/germanium. Further, a high concentration n-type polycrystal silicon 33 forming an emitter diffusion source and an emitter electrode is deposited, and patterning and annealing are applied to diffuse the n-type impurity into the single crystal silicon/germanium layer 51 in order to form an emitter region 53 (FIG. 33).

Subsequently, an insulating film 15 is deposited and an opening is formed into each of the regions for the emitter, base and collector, and an emitter electrode 101, a base electrode 102, and a collector electrode 103 are formed covering the opening to form a semiconductor device. FIG. 30 shows a cross sectional view in this state of a transistor with no collector region 4 which is higher by about one digit than the low concentration collector region 3 and a collector region 5 at a carrier concentration which is approximately equal to that of the collector region 4 (right portion in FIG. 33).

In this embodiment, since a high speed transistor and a high withstand voltage transistor can be mounted together, high speed signals processing can be conducted by the high speed transistor and, since the circuits for high signal outputs can be constituted with a high withstand voltage transistor, integrated circuits of high function can be attained by using such transistors.

Figure 34:
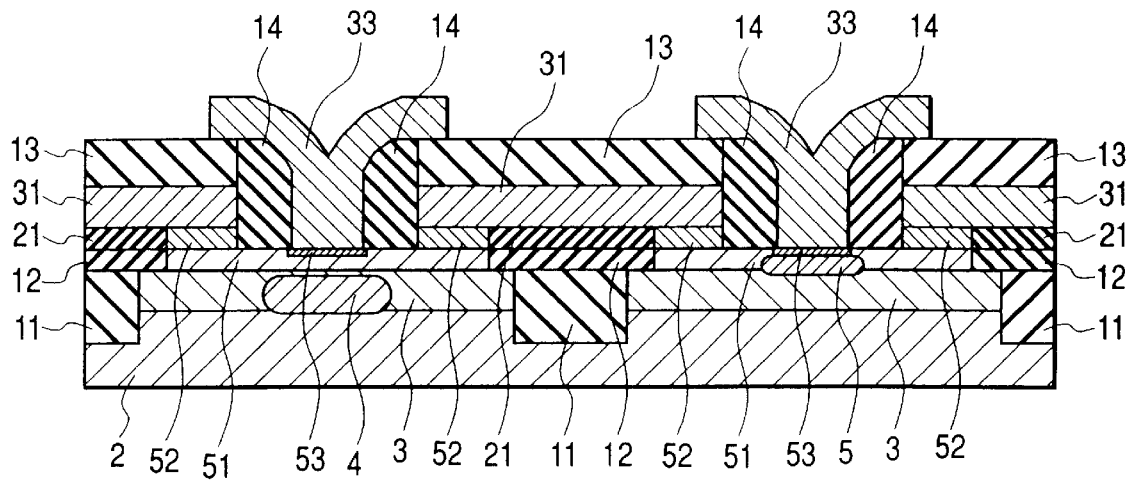
FIG. 34 is a fragmentary, enlarged cross sectional view illustrating a manufacturing method and another arrangement of a bipolar transistor according to the present invention.

FIG. 34 shows a cross sectional structure of a transistor in another constitution of this embodiment. This is an example of mounting together a transistor having only the collector region 4 which is higher by about one digit than the low concentration collector region 3 (left portion in FIG. 34), and a transistor having only a collector region 5 which is higher by about one digit than the low concentration collector region 3 (right portion in FIG. 34), in accordance with the operation speed and the withstand voltage of the transistors. It is apparent that the transistor shown in FIG. 3 or FIG. 30 can also be mounted together. The method of manufacturing such bipolar transistors will be easily understood in view of the foregoing descriptions.

Embodiment 19

Figure 35:
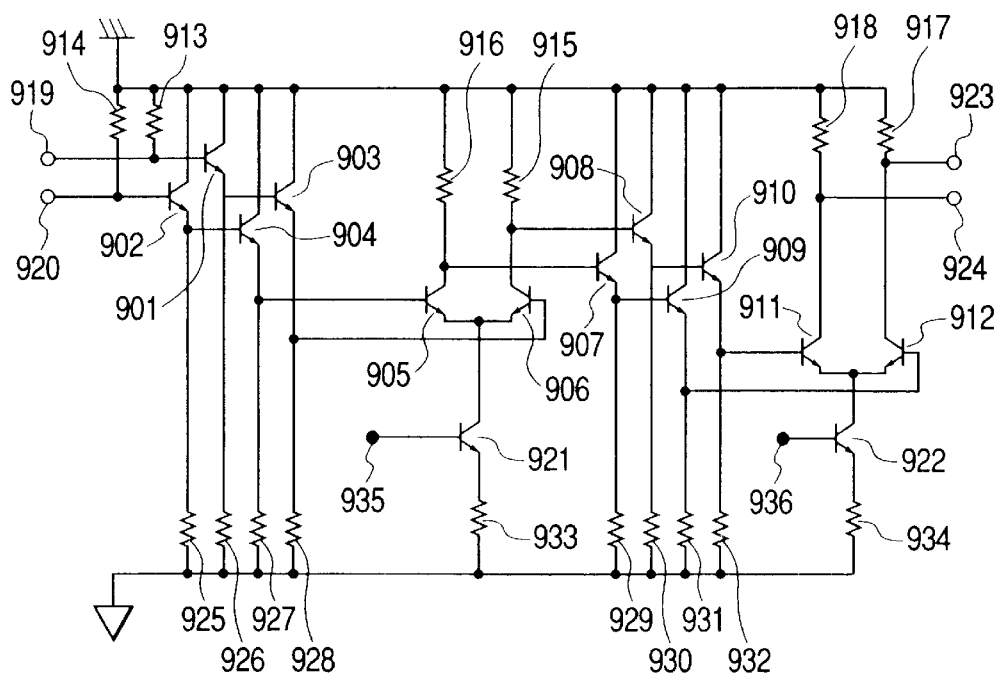
FIG. 35 is a circuit diagram for a high power amplifier showing another embodiment of a bipolar transistor according to the present invention.

FIG. 35 is a view showing a nineteenth embodiment of a bipolar transistor according to the present invention, which shows a circuit diagram of a high power amplifier as an example of an integrated circuit requiring transistors at high speed and also transistors with a high withstand voltage. This is an example of using the bipolar transistor according to the present invention described for the previous embodiment 16 as the transistors 911 and 912 on the circuit shown in FIG. 35.

FIG. 35 is a differential amplifier circuit showing, transistors 901 to 912, 921 and 922, resistors 913 to 918 and 925 to 934, input terminals 919 and 920, output terminals 923 and 924, and each of the terminals 935 and 936.

In the high power amplifier circuit, input signals amplified by way of the transistors 901 to 910 are amplified to the greatest amplitude in the final output differential amplifier stage, and then outputted. Therefore, the collector voltage of the transistors 911 and 912 is changed by the amplitude, and a high voltage is applied between the collector and the emitter of the transistor. In the high speed transistor, the withstand voltage in a trade off relationship with the high speed operation performance is sacrificed to some extent. Therefore, the semiconductor device can not provide a sufficient withstand voltage for the signal output at the great amplitude. Accordingly, when the transistor is used in this circuit, the transistor in the final output differential amplifier stage is sometimes destroyed. Use of the high withstand voltage transistor according to the present invention can avoid this problem and can mount a high speed signal processing circuit and a large signal output circuit together to attain an integrated circuit of high performance.

Each of the circuits can be constituted by applying any of the bipolar transistors according to the present invention explained with reference to Embodiments 1 to 17. In the transistor according to the present invention, since the base resistance and the collector/base capacitance can be reduced, the power consumption can also be reduced in PLL of the mobile wireless portable unit. Further, since the collector current can be designed to operate with high accuracy and the collector current varies less in the transistor according to the present invention, the signal voltage can be set to a low level, which enables further reduction of the power consumption.

In each of the embodiments described above, several or all of them may be used in combination. Further, the device according to the present invention can be obtained by using other semiconductors such as GaAs. Also, the p and n conductivity types in each of the embodiments can be used in a reversed manner. Further, the bipolar transistor in the embodiment can be operated with the emitter and the collector being reversed. Also, each of the embodiments may be used together with existing conventional semiconductor devices, such as MOS transistors. While preferred embodiments of the present invention have been explained, the present invention is not restricted to the embodiments described above, and various design modifications are possible within a range that does not depart from the sprit of the present invention.

As explained above, with reference to the means for the solution of the subject and various embodiments of the present invention, according to the present invention, it is possible to reduce the thickness of the base layer, which is necessary for increasing the operation speed of the bipolar transistor. That is, since the concentration of the base layer can be increased, sufficient collector/emitter withstand voltage or current gain can be maintained, even when the thickness of the base layer is reduced. As a result, a bipolar transistor operating with high accuracy and having high reliability and high gain and suitable to high speed operation can be manufactured.

Further, since the electrons in the base layer can be accelerated, the operation speed can be increased and, further, the collector current is controlled by the electric field in the base layer, it is possible to provide a bipolar transistor of capable of operating with high accuracy, and capable of exhibiting a good characteristic that the collector current fluctuates less relative to the change of the collector voltage and with less fluctuation of the collector current.

Further, a desired collector current can be designed easily, and it is possible to increase the operation speed and improve the performance of the circuit requiring high accuracy by adopting the transistor of the present invention, and, further, a bipolar transistor of high current gain, high cutoff frequency and high accuracy can be operated at a high current density.

Further, it is possible to reduce the variation of the base resistance, reduce the base resistance and, further, reduce the collector/base junction capacitance and the collector/substrate junction capacitance, which, in turn, can reduce the parasitic resistance and the parasitic capacitance thereby enabling operation at high speed and with low power consumption. Further, interference with adjacent transistors can be reduced, unnecessary noises from transistors of different operations can be suppressed and an integrated circuit at a high frequency and high performance can be obtained.

From the foregoing discussions, the performance can be improved over the entire circuit and the system by using the bipolar transistor according to the present invention.

As described above specifically, the present invention can provide a semiconductor device capable of high speed operation with no substantial change of the collector current, even when the collector voltage is varied.

The present invention can provide a semiconductor device of high accuracy enabling high speed operation having a characteristic that a collector current does not change upon a change in the collector voltage, and operates with less variation of the collector current.

The present invention can provide a bipolar transistor at high accuracy enabling high speed operation, and having a characteristic that the collector current does not change substantially even upon a change of the collector voltage.

For easy understanding of the drawings, main reference numerals are as shown below:

1 . . . silicon substrate,
2 . . . high concentration n-type buried layer,
3 . . . low concentration n-type collector layer,
4,5 . . . n-type diffusion layer,
6, 53 . . . high concentration n-type diffusion layer,
11, 12, 13, 14, 15, 16, 17, 18 . . . silicon oxide film,
21 . . . silicon nitride film,
31 . . . polycrystal silicon or polycrystal silicon/germanium,
32, 33, 34, 35 . . . polycrystal silicon,
41, 42, 43 . . . metal or silicide film (reaction film between silicon and metal,
51 . . . single crystal silicon/germanium,
52 . . . polycrystal silicon or polycrystal silicon/germanium,
101, 102, 103 . . . electrode,
300 . . . semiconductor integrated circuit constituting a preamplifier circuit formed on one single semiconductor substrate,
301 . . . power source terminal,
302 . . . grounding terminal,
303 . . . decoupling capacitor,
401 . . . optical fiber,
402 . . . lens,
403 . . . photo-diode,
404 . . . preamplifier IC,
405 . . . wiring,
405 . . . output terminal,
407 . . . substrate,
408 . . . hermetic seal package.
500 . . . transmission module for optical transmission system
501 . . . electrical signal,
502 . . . driver,
503 . . . external modulator,
504, 504 . . . optical fiber,
510 . . . light receiving module for optical transmission system, 520 . . . front end module,
521 . . . photodetector,
522 . . . preamplifier,
530 . . . main amplifier portion,
531 . . . automatic gain controller,
531 . . . main amplifier,
540 . . . decision circuit,
550 . . . clock extraction portion,
551 . . . full wave rectifier.
552 . . . filter,
553 . . . phase-shifter,
554 . . . limit amplifier,
560 . . . digital signal processing circuit,
570 . . . demultiplexer DMUX,
601 . . . antenna,
602 . . . switch for switching transmission/reception,
603 . . . low noise amplifier,
604 . . . down mixer,
605, 610 . . . oscillator,
606 . . . synthesizer,
607 . . . power amplifier,
608 . . . up mixer,
609 . . . demodulator,
611 . . . PLL (Phase Locked Loop),
612 . . . modulator,
613 . . . base band unit,
701–712 . . . transistor,
713, 714 . . . resistor,
719–724 . . . terminal,
717, 718 . . . power source,
801–804, 809, 810 . . . transistor,
813, 814 . . . resistance,
819–824 . . . terminal,
817 . . . current source,
901–912, 921, 922 . . . transistor,
913–918, 925–934 . . . resistor,
919, 920, 923, 924, 935, 936 . . . terminals.

What is claimed is:

1. A semiconductor device comprising: a first semiconductor region having a first conductivity type, a second semiconductor region and a third semiconductor region each forming a junction with the first semiconductor region and each having a second conductivity type opposite to the first conductivity type, wherein a band gap for the first semiconductor region is smaller than the band gap for the second and the third semiconductor regions, wherein the band gap of the first semiconductor region has a substantially constant region near the junction between the first semiconductor region and the second semiconductor region, and wherein said band gap of the first semiconductor region decreases from the substantially constant region to the junction between the first semiconductor region and the third semiconductor region, wherein the second semiconductor region has a fourth semiconductor region of said second conductivity type with a band gap larger than that for the second semiconductor region connected with the second semiconductor region on the opposite side of the junction between the first semiconductor region and the second semiconductor region.

2. A semiconductor device comprising: a first semiconductor region having a first conductivity type, a second semiconductor region and a third semiconductor region each forming a junction with the first semiconductor region and each having a second conductivity type opposite to the first conductivity type, wherein the band gap for the first semiconductor region is smaller than the band gap for the second and the third semiconductor regions, and the band gap for the first semiconductor region increases and decreases near the junction between the first semiconductor region and the second semiconductor region from the second semiconductor region to the junction between the first semiconductor region and the third semiconductor region, wherein the band gap for the first semiconductor region has a substantially constant region near the junction between the first semiconductor region and the third semiconductor region.

3. A semiconductor device comprising: a first semiconductor region having a first conductivity type, a second semiconductor region and a third semiconductor region each forming a junction with the first semiconductor region and each having a second conductivity type opposite to the first conductivity type, wherein the band gap for the first semiconductor region is smaller than the band gap for the second and the third semiconductor regions, and the band gap for the first semiconductor region increases and decreases near the junction between the first semiconductor region and the second semiconductor region from the second semiconductor region to the junction between the first semiconductor region and the third semiconductor region, wherein the band gap for the third semiconductor region is substantially equal with the band gap for the first single crystal semiconductor region near the junction with the first semiconductor region.

4. A semiconductor device comprising: a first semiconductor region having a first conductivity type, a second semiconductor region and a third semiconductor region each forming a junction with the first semiconductor region and each having a second conductivity type opposite to the first conductivity type, wherein the band gap for the first semiconductor region is smaller than the band gap for the second and the third semiconductor regions, and the band gap for the first semiconductor region increases and decreases near the junction between the first semiconductor region and the second semiconductor region from the second semiconductor region to the junction between the first semiconductor region and the third semiconductor region, wherein the second semiconductor region has a fourth semiconductor region of said second conductivity type with a band gap larger than that for the second semiconductor region connected with the second semiconductor region on the opposite side of the junction between the first semiconductor region and the second semiconductor region.

5. A semiconductor integrated circuit device comprising:
a semiconductor substrate; and
a semiconductor integrated circuit including a plurality of semiconductor devices on said semiconductor substrate, each of said semiconductor devices comprising:
a first semiconductor region having a first conductivity type;
a second semiconductor region forming a junction with said first semiconductor region and having a second conductivity type opposite to the first conductivity type; and
a third semiconductor region forming a junction with said first semiconductor region and having said second conductivity type opposite to the first conductivity type,
wherein the band gap for said first semiconductor region is smaller than the band gap for said second and third semiconductor regions,
wherein the band gap for said first semiconductor region has a substantially constant region near the junction between said first semiconductor region and said second semiconductor region and wherein said band gap for said first semiconductor region decreases from said substantially constant region to the junction between said first semiconductor region and said third semiconductor region, and wherein at least two semiconductor devices selected from said semiconductor devices have different frequency characteristics and collector withstand voltage characteristics from each other.

6. A semiconductor integrated circuit device comprising:

an amplifier circuit including at least one pair of bipolar transistors having at least a pair of emitters which are connected with each other; and a semiconductor device formed by the pair of bipolar transistors, said semiconductor device comprising:
  a first semiconductor region having a first conductivity type;
  a second semiconductor region forming a junction with said first semiconductor region and having a second conductivity type opposite to the first conductivity type; and
  a third semiconductor region forming a junction with said first semiconductor region and having said second conductivity type opposite to the first conductivity type, wherein the band gap of said first semiconductor region is smaller than the band gap for said second and said third semiconductor regions, and wherein the band gap for said first semiconductor region has a substantially constant region near the junction between said first semiconductor region and said second semiconductor region and wherein the band gap for said first semiconductor region decreases from said substantially constant region to the junction between said first semiconductor region and said third semiconductor region.

* * * * *